(12) United States Patent
Fiolka et al.

(10) Patent No.: US 9,013,680 B2
(45) Date of Patent: Apr. 21, 2015

(54) ILLUMINATION SYSTEM OF A MICROLITHOGRAPHIC PROJECTION EXPOSURE APPARATUS

(75) Inventors: Damian Fiolka, Oberkochen (DE); Ralf Mueller, Aalen (DE); Andras G. Major, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 612 days.

(21) Appl. No.: 12/836,436

(22) Filed: Jul. 14, 2010

(65) Prior Publication Data

US 2010/0277708 A1     Nov. 4, 2010

Related U.S. Application Data

(63) Continuation of application No. 12/646,021, filed on Dec. 23, 2009, now Pat. No. 7,782,443.

(30) Foreign Application Priority Data

Dec. 23, 2008 (EP) ..................................... 08022311

(51) Int. Cl.
*G03F 7/20* (2006.01)

(52) U.S. Cl.
CPC ........ *G03F 7/70208* (2013.01); *G03F 7/70116* (2013.01)

(58) Field of Classification Search
CPC ............ G03F 7/70116; G03F 7/70208; G03F 7/70091; G03F 7/70125; G03F 7/702; G03F 7/70466; G03F 7/7055
USPC ........................ 355/52, 53, 55, 67–71, 77, 46; 250/492.1, 492.2, 492.22, 548; 359/264, 618
See application file for complete search history.

(56) References Cited

U.S. PATENT DOCUMENTS 6,060,224 A  *  5/2000  Sweatt et al. .................. 430/395
6,081,319 A  *  6/2000  Ozawa et al. .................... 355/67

(Continued)

FOREIGN PATENT DOCUMENTS

EP          1 262 836        12/2002
WO    WO 2005/026843        3/2005

(Continued)

OTHER PUBLICATIONS

The European Search Report for the corresponding Application No. EP 08 022 311.8, dated Jun. 25, 2009.

*Primary Examiner* — Christina Riddle
(74) *Attorney, Agent, or Firm* — Fish & Richardson P.C.

(57) ABSTRACT

An illumination system of a microlithographic projection exposure apparatus includes a beam deflection array including a number beam deflection elements, for example mirrors. Each beam deflection element is adapted to deflect an impinging light beam by a deflection angle that is variable in response to control signals. The light beams reflected from the beam deflection elements produce spots in a system pupil surface. The number of spots illuminated in the system pupil surface during an exposure process, during which a mask is imaged on a light sensitive surface, is greater than the number of beam deflection elements. This may be accomplished with the help of a beam multiplier unit that multiplies the light beams reflected from the beam deflection elements. In another embodiment the beam deflecting elements are controlled such that the irradiance distribution produced in the system pupil surface changes between two consecutive light pulses of an exposure process.

22 Claims, 15 Drawing Sheets

(56) References Cited

U.S. PATENT DOCUMENTS

| | | | |
|---|---|---|---|
| 6,285,488 B1* | 9/2001 | Sandstrom | 359/290 |
| 6,515,257 B1 | 2/2003 | Jain et al. | |
| 6,587,182 B1 | 7/2003 | Goto | |
| 6,737,662 B2* | 5/2004 | Mulder et al. | 250/548 |
| 7,061,582 B2 | 6/2006 | Zinn et al. | |
| 2002/0171816 A1* | 11/2002 | Markle | 355/67 |
| 2002/0176166 A1 | 11/2002 | Schuster | |
| 2005/0012916 A1 | 1/2005 | Van Der Mast et al. | |
| 2005/0018164 A1* | 1/2005 | Hansen | 355/69 |
| 2005/0099614 A1* | 5/2005 | Sugita et al. | 355/53 |
| 2006/0055909 A1 | 3/2006 | Fiolka et al. | |
| 2006/0087634 A1* | 4/2006 | Brown et al. | 355/69 |
| 2006/0181692 A1* | 8/2006 | Boettiger et al. | 355/71 |
| 2006/0244941 A1 | 11/2006 | Gruner et al. | |
| 2007/0165202 A1* | 7/2007 | Koehler et al. | 355/67 |
| 2007/0258077 A1 | 11/2007 | Tanaka et al. | |
| 2008/0011968 A1* | 1/2008 | Tanaka et al. | 250/492.2 |
| 2009/0115990 A1 | 5/2009 | Owa et al. | |
| 2009/0117494 A1* | 5/2009 | Owa | 430/322 |
| 2009/0135395 A1* | 5/2009 | Melzer et al. | 355/67 |
| 2009/0168039 A1* | 7/2009 | Kok et al. | 355/67 |
| 2010/0060873 A1 | 3/2010 | Deguenther et al. | |

FOREIGN PATENT DOCUMENTS

| | | |
|---|---|---|
| WO | WO 2006097135 A1 * | 9/2006 |
| WO | WO 2008019860 A * | 2/2008 |
| WO | WO 2008/131928 | 11/2008 |
| WO | WO 2009/080310 | 7/2009 |

* cited by examiner

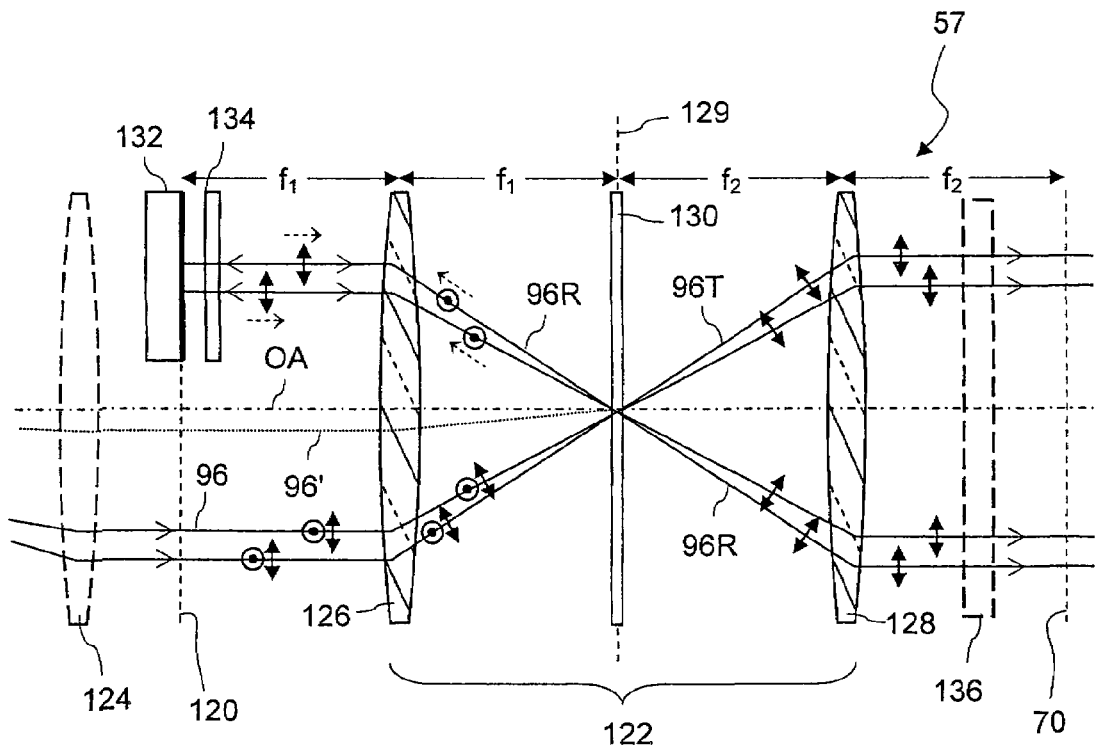
Fig. 18
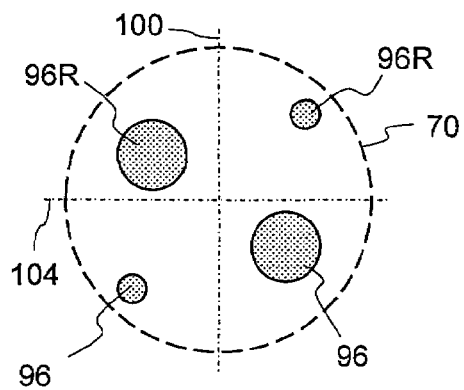 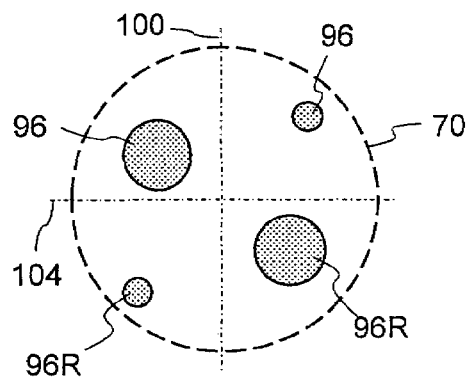
Fig. 19   Fig. 20

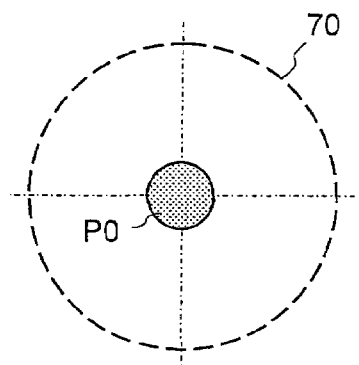
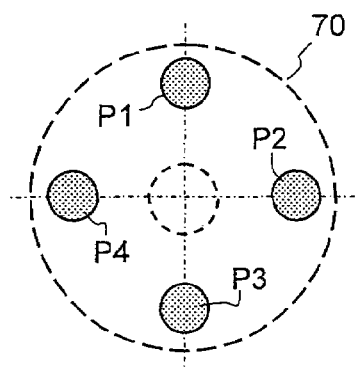
Fig. 27a          Fig. 27b
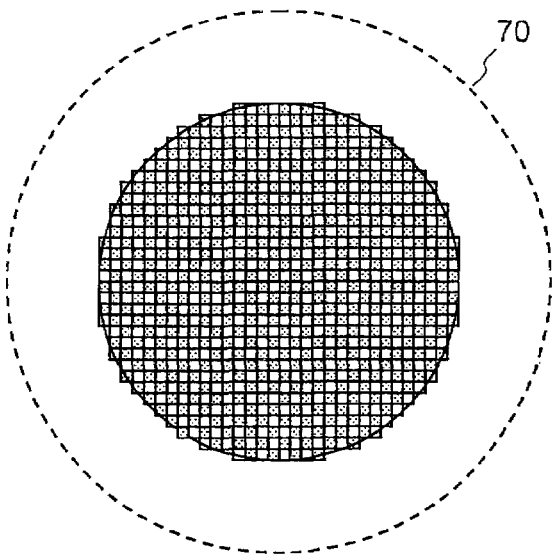
Fig. 28a
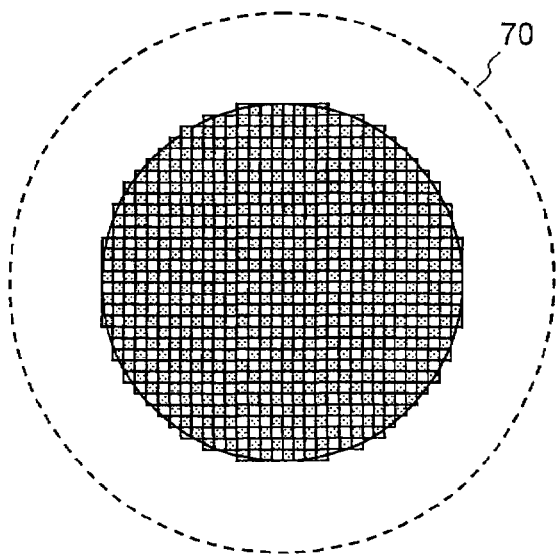
Fig. 28b

ILLUMINATION SYSTEM OF A MICROLITHOGRAPHIC PROJECTION EXPOSURE APPARATUS

CROSS-REFERENCE TO RELATED APPLICATIONS

This application is a continuation of U.S. application Ser. No. 12/646,021, filed Dec. 23, 2009, now U.S. Pat. No. 7,782,443, which claims benefit of European Patent Application EP 08 022 311.8, filed Dec. 23, 2008. The contents of these applications are hereby incorporated by reference in its entirety.

BACKGROUND

The disclosure generally relates to illumination systems of microlithographic exposure apparatus that image a mask onto a light sensitive surface. More particularly, the disclosure relates to such illumination systems that contain an array of mirrors or other beam deflection elements. The disclosure further relates to a method of operating a microlithographic projection exposure apparatus.

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) or extreme ultraviolet (EUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction. The ratio of the velocity of the wafer and the velocity of the mask is equal to the magnification of the projection objective, which is usually smaller than 1, for example 1:4.

The illumination system illuminates a field on the mask that may have the shape of a rectangular or curved slit, for example. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may require a different angular distribution than small sized features. The most commonly used angular distributions of projection light are referred to as conventional, annular, dipole and quadrupole illumination settings. These terms refer to the irradiance distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

There are a variety of different ways to modify the angular distribution of the projection light in the mask plane so as to achieve the desired illumination setting. For achieving maximum flexibility in producing different angular distribution in the mask plane, it has been proposed to use mirror arrays that illuminate the pupil surface.

In EP 1 262 836 A1 the mirror array is realized as a micro-electromechanical system (MEMS) comprising more than 1000 microscopic mirrors. Each of the mirrors can be tilted about two orthogonal tilt axes. Thus radiation incident on such a mirror device can be reflected into almost any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of spots, wherein each spot is associated with one particular microscopic mirror and is freely movable across the pupil surface by tilting this mirror.

Other illumination systems are known from US 2006/0087634 A1, U.S. Pat. No. 7,061,582 B2 and WO 2005/026843 A2. Arrays of tiltable mirrors have also been proposed for EUV illumination systems.

SUMMARY

In general, the quality of the image produced by the projection objective depends very sensitively on the irradiance distribution in the system pupil surface. Thus, it can be desirable to be able to produce very small changes of the irradiance distribution. This is generally possible only if a very large number of (e.g., small) spots can be produced with the help of the mirrors in the system pupil surface. However, the manufacture and control of arrays comprising several thousand mirrors is generally difficult and can require substantial resources. Thus there is a need for an illumination systems which include an array of mirrors or other beam deflection elements for producing a number of spots in a system pupil surface, where this number is large compared with the complexity of the array of beam deflection elements.

In a first aspect, the invention features an illumination system including a beam deflection array of reflective or transparent beam deflection elements. Each beam deflection element is adapted to deflect an impinging light beam by a deflection angle that is preferably variable in response to control signals. The illumination system further includes a system pupil surface and a beam multiplier unit which is arranged between the beam deflection array and the system pupil surface such that the number of light beams in the system pupil surface is greater than the number of light beams emerging from the beam deflection array.

In certain aspects, the invention is based, at least partly, on the consideration that the number of spots illuminated in the system pupil surface can be increased, at a given time, by multiplying the light beams producing the spots in the system pupil surface. Thus not one but at least two spots in the system pupil surface will move simultaneously if the deflection angle of a beam deflection element is varied. Since many target irradiance distributions in the system pupil surface have certain symmetries, for example mirror or point symmetry, complex irradiance distributions in the system pupil surface can be produced if the multiplied light beams emerge from the beam multiplier unit with a symmetry that is adapted to the symmetry of the target irradiance distributions. The symmetry of the light beam emerging from the beam multiplier unit is, in turn, determined by the layout of the beam multiplier unit and its arrangement with respect to the beam deflection array and other components of the illumination system.

The beam multiplier unit may include elements that are known in the art to divide a light beam into two or more light beams. For example, the beam multiplier unit may comprise a plurality of densely arranged wedges. If the light beams are directed such that they are centered on the edges of the wedges, they will be divided into two partial light beams because different portions of the light beams are refracted at surfaces having different orientations. In a similar embodiment, small pyramidal structures are arranged on a support plate which have a similar effect in two dimensions so that a light beam impinging on the corner of the pyramidal structures will be split into four partial light beams. However, in these cases it may be necessary to direct the incident light beams on certain locations on the wedges, the pyramidal structures or similar arrangements of refractive elements.

This disadvantage can be avoided, for example, if the beam multiplier unit includes a beam splitter. A beam splitter may be designed such that the same beam splitting properties are achieved over the entire surface of the beam splitter, and some types of beam splitters even split impinging light beams into two partial light beams irrespective of the angle of incidence.

All kinds of beam splitters known in the art may be envisaged in this context. For example, the beam splitter may include a birefringent material that splits light beams into an ordinary and an extraordinary light beam having orthogonal states of polarization. For producing extraordinary light beams that leave the birefringent material at some distance from the ordinary light beams, the birefringent material should be relatively thick.

Therefore beam splitters that include a beam splitting surface may be more preferable in this respect. The beam splitting surface may be formed by a surface at which frustrated total internal reflection occurs, as is the case in conventional beam splitter cubes. Beam splitting surfaces in which interference effects occur, for example optical coatings or gratings applied on a support, have the advantage that the beam splitters are less bulky than beam splitter cubes. In some embodiments, the beam splitting surface is (e.g., at least substantially) polarization independent such that it splits an incoming light beam into a reflected and a transmitted light beam irrespective of the state of polarization of the incident light beam. In other embodiments the beam splitting surface is polarization dependent such that the intensity of the reflected and the transmitted partial light beams (e.g., strongly) depend on the state of polarization of the incident light beam.

In some embodiments, the ratio of the transmittance versus the reflectance of the beam splitting surface is between 100 and 0.01, e.g., between 5 and 0.2. In many embodiments the beam splitting surface has a transmittance versus reflectance ratio of about 1, or at least between 0.95 and 1.05. This ensures that the partial light beams produced by the beam splitting surface have at least substantially the same irradiance. However, it may also be considered to deliberately depart from this relationship. If the transmittance versus reflectance ratio differs from 1, for example lies between 7/3 and 3/7, the spots produced in the system pupil surface can have a different irradiance. This may be used to adjust certain pupil related quantities such as telecentricity and pole balance.

In certain embodiments, the beam splitting surface is formed by a beam splitting coating applied on a support. As has been mentioned above, such optical coatings exploit interference effects for splitting an incident light beam into a reflected and a transmitted light beam. Usually the beam splitting coatings comprise a plurality of thin layers having a well defined refractive index and layer thickness. By carefully selecting these parameters it is possible to manufacture beam splitting coatings having well defined properties for light having a certain wavelength or range of wavelengths.

In some embodiments, the beam splitting surface is plane and extends parallel to an optical axis of the illumination system. The optical axis of the illumination system is defined by the symmetry axis of lenses and other optical elements having rotational symmetry. With such a plane beam splitting surface extending parallel to the optical axis, and preferably containing the optical axis, it is possible to produce mirror symmetries in the system pupil surface which makes it possible to produce target irradiance distribution in the system pupil surface having similar symmetries.

With such beam splitting surfaces it may be advantageous if the beam splitting surface has a transmittance versus reflectance ratio that varies along the optical axis. In typical arrangements the irradiance unbalance will then increase the further a spot in the system pupil surface is illuminated away from the optical axis.

In some embodiments, an actuator for moving the beam splitting surface is provided. This may be advantageous if it is desirable to produce target irradiance distributions having different symmetry properties.

The beam splitting surface may be displaced so as to displace also the plane of symmetry in the system pupil surface. Additionally or alternatively, the actuator may be configured to rotate the beam splitting surface. This results in a corresponding rotation of the plane of symmetry in the system pupil surface. This makes it possible to produce one of two orthogonal planes of symmetry by rotating a single beam splitting surface with the help of the actuator by 90°.

In certain embodiments, the actuator is capable of completely removing the beam splitting surface from a light propagation path. This makes it possible to add or remove a plane of symmetry in the system pupil surface.

In some embodiments, the beam multiplier unit includes at least two plane beam splitting surfaces arranged at an angle which at least substantially equals 90°. If suitably arranged with regard to the array of beam deflection elements, it can be achieved that each incident light beam is divided into four partial light beams passing mirror symmetrically through the system pupil surface.

In certain embodiments, the at least two plane beam splitting surfaces, which are arranged at an angle which at least substantially equals 90°, are arranged in planes intersecting at the optical axis of the illumination system. Thus the planes of symmetry in the system pupil surface also intersect in the center of the system pupil surface, as it is usually desired.

The beam splitter unit can include a plane mirror which is arranged with respect to the beam splitting surface at an angle which at least substantially equals 90°. Light beams impinging first on the beam splitting surface are split into partial light beams forming spots in the system pupil plane that form, as a result of one of the partial light beams being reflected by the mirror, a point-symmetrical arrangement in the system pupil surface. In contrast, light beams impinging first on the mirror and then on the beam splitting surface produce spots in the system pupil plane that are arranged mirror symmetrically. Thus, in some embodiments, it possible to produce multiplied spots in the system pupil surface that are point-symmetrically arranged, and also spots that are mirror-symmetrically arranged. This greatly increases the range of irradiance distributions that can be produced with the help of the multiplied light beams.

Further, the beam splitting surface and the mirror may be arranged in planes intersecting at the optical axis of the illumination system. Thus the point defining the reference for the point-symmetry coincides with the optical axis, and also the symmetry plane defining the mirror-symmetry contains the optical axis.

If the beam deflection array is centered with respect to the optical axis, the overall system symmetry can be increased which simplifies the layout and control of the beam deflection array.

An even more symmetrical arrangement may be obtained if the optical axis divides the beam deflection array into at least two sub-arrays, which are arranged in an inclined manner with respect to each other. This may require to direct the light beams on the beam deflection sub-arrays from directions which are also inclined.

If the beam multiplier unit comprises a plane mirror and a beam splitting surface, the beam multiplier unit may be configured such that each light beam impinges first on the plane mirror and then on the beam splitting surface, or first on the beam splitting surface and then on the plane mirror. Then it is ensured that each light beam is divided into two partial light beams forming spots in the system pupil plane which are either point-symmetrically or mirror-symmetrically arranged.

If n planar beam splitting surfaces are arranged such that they extend in planes intersecting along a common line and forming the same angle in between, the arrangement of the multiplied spots in the system pupil surface will have an n-fold symmetry. Generally, the beam multiplier unit may be configured to produce a multiplied irradiance distribution in the system pupil surface which is mirror-symmetrical, point-symmetrical, or n-fold symmetrical with respect to an original irradiance distribution that would be produced in the system pupil surface in the absence of the beam multiplier unit.

In certain embodiments, the illumination system includes an intermediate pupil surface which is arranged between the beam deflection array and the beam multiplier unit. The beam multiplier unit includes an imaging system which establishes an imaging relation between the intermediate pupil surface and the system pupil surface. Furthermore, the beam multiplier unit is configured to produce a multiplied image of an irradiance distribution which is produced by the beam deflection array in a portion of the intermediate pupil surface.

Although also in this embodiment light beams are multiplied, it may be said that this embodiment makes it possible to multiply not only light beams as such, but a complete irradiance distribution in a pupil surface.

If the imaging system is a telecentric objective, the light beams emerging from the system pupil surface will have the same angular distribution as the light beams emerging from the intermediate pupil surface.

The beam multiplier unit can include a mirror arranged in another portion of the intermediate pupil surface, wherein the beam multiplier unit is configured to produce an image of the irradiance distribution on the mirror. Thus the beam multiplier unit multiplies the irradiance distribution, which is produced in one portion of the intermediate pupil surface, by forming an image of this distribution in another portion of the intermediate pupil surface. Then the original distribution and its image are imaged on the system pupil surface by the imaging system.

To this end the beam multiplier unit can include a polarization dependent beam splitter, which is arranged within the imaging system, for example in an aperture plane of an objective forming the imaging system. Then light reflected from the polarization dependent beam splitter may form on the mirror an additional irradiance distribution in the intermediate pupil surface.

In order to be able to form an image of the additional irradiance distribution formed on the mirror, the beam multiplier unit can include a polarization unit that changes the state of polarization of light reflected from the mirror before it impinges again on the polarization dependent beam splitter. As a result of the change of the state of polarization, this light (or at least a portion thereof) can pass through the polarization dependent beam splitter and form an image in the system pupil plane of the additional irradiance distribution formed on the mirror.

Transparent beam deflection elements of the beam deflection array may be formed by electro-optical or acousto-optical elements, for example. In such elements the refractive index can be varied by exposing a suitable material to electric fields for ultrasonic waves, respectively. These effects can be exploited to produce index gratings that direct impinging light into various directions.

In certain embodiments, however, the beam deflection elements are mirrors that can be tilted about at least one tilt axis. If the mirrors can be tilted about two tilt axes, the angle formed between these tilt axes is preferably about 90°.

In certain aspects, the invention features a method of operating a projection exposure apparatus, including providing an illumination system that includes a beam deflection array of reflective or transparent beam deflection elements, wherein each beam deflection element is adapted to deflect an impinging light beam by a deflection angle that is variable in response to control signals, and a system pupil surface in which an irradiance distribution is produced by the beam deflection array. The method further includes illuminating a mask with light pulses, wherein the beam deflecting elements are controlled such that the illuminated area associated with an irradiance distribution produced in the system pupil surface changes between two consecutive light pulses of an exposure process during which a mask is imaged on a light sensitive surface; and imaging the mask on a light sensitive surface.

The number of spots illuminated in the system pupil surface can be, at a given instant, equal to the number of beam deflection elements. However, during an exposure process, during which a mask is imaged on a light sensitive surface, the number of spots illuminated in the system pupil surface can be greater than the number of beam deflection elements because these spots are moved during the exposure process.

The target irradiance distribution may be divided into a plurality of partial irradiance distributions to which different illuminated areas are associated. The beam deflecting elements are then controlled such that all partial irradiance distributions are successively produced in the system pupil surface. In other words, the system pupil surface is successively filled with the desired target irradiance distribution.

If the mask and the light sensitive surface are moved during the exposure process so that two points on the mask spaced apart along a scan direction are illuminated during exposure time intervals having different starting times, all partial irradiance distributions should, for an arbitrary point on the mask, be produced in the system pupil surface during the exposure time interval associated with that point. Then also in a projection exposure apparatus of the scanner type all points on the mask will receive the same total irradiance distribution which is successively produced in the system pupil surface during the exposure time interval.

In some embodiments, the partial irradiance distributions are produced in the system pupil plane during equal time intervals. For example, there may be a fixed period at which the irradiance distribution in the system pupil surface is changed between two or more different configurations.

The illuminated areas associated with the partial irradiance distributions may be restricted to a segment, in particular to a semicircle or a quadrant, of the system pupil surface.

In certain embodiments, the partial irradiance distributions are interleaved. This can have the advantage that the spots produced by the beam deflection elements in the system pupil surface have to be moved by small distances only. This simplifies the control of the beam deflection elements and reduces mechanical strains.

An illumination system of a microlithographic projection exposure apparatus can be configured to illuminate a mask with light pulses and comprises a beam deflection array of reflective or transparent beam deflection elements. Each beam deflection element is adapted to deflect an impinging light beam by a reflection angle that is variable in response to control signals. The illumination system can include a system pupil surface in which an irradiance distribution is produced by the beam deflection array, and a control unit, wherein the control unit is configured to control the beam deflection elements such that the illuminated area associated with an irradiance distribution produced in the system pupil surface changes between two consecutive light pulses of an exposure process during which a mask is imaged on a light sensitive surface.

In some embodiments, an illumination system of a microlithographic projection exposure apparatus includes a beam deflection array including a number of reflective or transparent beam deflection elements. Each beam deflection element is adapted to deflect an impinging light beam by deflection angles that is variable in response to control signals. The illumination system further includes a system pupil surface, in which light beams reflected from the beam deflection elements illuminate spots. The number of spots illuminated in the system pupil surface during an exposure process, during which a mask is imaged on a light sensitive surface, is greater than the number of beam deflection elements.

This may be achieved either in the time domain, i.e., by producing successively different irradiance distributions in the system pupil surface during the exposure process. Alternatively or additionally, the number of spots illuminated in the system pupil surface is greater than the number of beam deflection elements at any given instant during the exposure process. This can require the use of a beam multiplier unit that multiplies the number of light beams emerging from the beam deflection array.

In either case this results in an illumination system in which the effective irradiance distribution in the system pupil surface, i.e., the irradiance distribution integrated over the exposure time interval, has, for a given number of beam deflection elements, a very high resolution. This advantage may be used either to improve the resolution of the irradiance distribution in the system pupil surface with a given number of beam deflection elements, or to reduce the number of beam deflection elements if a predetermined resolution of the irradiance distribution in the system pupil surface has to be achieved.

Various aspects of the invention are summarized below.

In general, in one aspect, the invention features an illumination system of a microlithographic projection exposure apparatus that includes a beam deflection array of reflective or transparent beam deflection elements, wherein each beam deflection element is adapted to deflect an impinging light beam by a deflection angle; a system pupil surface; and a beam multiplier unit arranged between the beam deflection array and the system pupil surface such that the number of light beams in the system pupil surface is greater than the number of light beams emerging from the beam deflection array.

Embodiments of the illumination system can include one or more of the following features. For example, the beam multiplier unit can include a beam splitter. The beam splitter can include a beam splitting surface. The beam splitting surface can have a transmittance/reflectance ratio of about 1. The beam splitting surface can be formed by a beam splitting coating applied on a support. The beam splitting surface can be a plane and can extends parallel to an optical axis of the illumination system. The beam splitting surface can have a transmittance versus reflectance ratio that varies along the optical axis. The illumination system can include an actuator for moving the beam splitting surface.

The actuator can be configured to rotate the beam splitting surface. The actuator can be capable of completely removing the beam splitting surface from a light propagation path.

In some embodiments, the beam multiplier unit includes at least two plane beam splitting surfaces arranged at an angle which at least substantially equals 90°. The at least two plane beam splitting surfaces can be arranged in planes intersecting at the optical axis of the illumination system.

In certain embodiments, the beam multiplier unit includes a plane mirror which is arranged with respect to the beam splitting surface at an angle which at least substantially equals 90°. The beam splitting surface and the mirror are arranged in planes intersecting at the optical axis of the illumination system. The beam deflection array can be centered with respect to the optical axis. The optical axis can divide the beam deflection array into at least two sub-arrays, which are arranged in an inclined manner with respect to each other. The beam multiplier unit can be configured such that each light beam impinges first on the plane mirror and then on the beam splitting surface, or first on the beam splitting surface and then on the plane mirror.

The beam deflection array can produce, in the absence of the beam multiplier unit, a first irradiance distribution in the system pupil surface, and wherein the beam multiplier unit is configured to produce a second irradiance distribution in the system pupil surface which is mirror symmetrical, point symmetrical or n-fold symmetrical with respect to the first irradiance distribution.

In another aspect, the invention features an illumination system that includes an intermediate pupil surface which is arranged between a beam deflection array and a beam multiplier unit, wherein the beam multiplier unit includes an imaging system, which establishes an imaging relation between the intermediate pupil surface and the system pupil surface, and wherein the beam multiplier unit is configured to produce a multiplied image of an irradiance distribution, which is produced by the beam deflection array in a portion of the intermediate pupil surface.

Embodiments of the illumination system can include one or more of the following features and/or features of other aspects. For example, the imaging system can be a telecentric objective. The beam multiplier unit can include a mirror arranged in another portion of the intermediate pupil surface, and wherein the beam multiplier unit is configured to produce an image of the irradiance distribution on the mirror. The beam multiplier unit can include a polarization dependent beam splitter, which is arranged within the imaging system. The objective has an aperture plane in which the polarization dependent beam splitter is arranged. The beam multiplier unit can be configured such that light reflected from the polarization dependent beam splitter impinges on the mirror. The beam multiplier unit can include a polarization unit that changes the state of polarization of light reflected from the mirror before it impinges again on the polarization dependent beam splitter.

In another aspect, the invention features an illumination system of any preceding aspect, characterized in that the beam deflection elements are mirrors that can be tilted about at least one tilt axis (e.g., two orthogonal tilt axes).

In general, in a further aspect, the invention features a method of operating a projection exposure apparatus, including the following steps: (a) providing an illumination system that includes a beam deflection array of reflective or transparent beam deflection elements, wherein each beam deflection element is adapted to deflect an impinging light beam by a deflection angle that is variable in response to control signals, and a system pupil surface in which an irradiance distribution is produced by the beam deflection array; (b) illuminating a mask with light pulses, wherein the beam deflecting elements are controlled such that the illuminated area associated with an irradiance distribution produced in the system pupil surface changes between two consecutive light pulses of an exposure process during which a mask is imaged on a light sensitive surface; and (c) imaging the mask on a light sensitive surface.

Implementations of the method can include one or more of the following features and/or features of other aspects. For example, a target irradiance distribution can be divided into a plurality of partial irradiance distributions to which different illuminated areas are associated, and wherein the beam deflecting elements are controlled such that all partial irradiance distributions are successively produced in the system pupil surface. The mask and the light sensitive surface can be moved during the exposure process so that two points on the mask spaced apart along a scan direction are illuminated during exposure time intervals ($\Delta T$) having different starting times, and wherein, for an arbitrary point on the mask, all partial irradiance distributions are produced in the system pupil surface during the exposure time interval associated with that point.

The time intervals (P), during which the partial irradiance distributions are produced in the system pupil plane, can all be equal. The illuminated areas associated with the partial irradiance distributions can be restricted to a segment, in particular to a semicircle or a quadrant, of the system pupil surface. The partial irradiance distributions can be interleaved.

In general, in a further aspect, the invention features an illumination system of a microlithographic projection exposure apparatus, wherein the illumination system is configured to illuminate a mask with light pulses and includes a beam deflection array of reflective or transparent beam deflection elements, wherein each beam deflection element is adapted to deflect an impinging light beam by a deflection angle that is variable in response to control signals, a system pupil surface in which an irradiance distribution is produced by the beam deflection array, a control unit, wherein the control unit is configured to control the beam deflection elements such that the illuminated area associated with an irradiance distribution produced in the system pupil surface changes between two consecutive light pulses ($LP_n$, $LP_{n+1}$) of an exposure process during which the mask is imaged on a light sensitive surface.

Embodiments of the illumination system can include one or more of the following features and/or features of other aspects. For example, the control unit can be configured to divide a target irradiance distribution into a plurality of partial irradiance distributions to which different illuminated areas are associated, and wherein the control unit is further configured to control the beam deflecting elements such that all partial irradiance distributions are successively obtained in the system pupil surface.

In general, in another aspect, the invention features an illumination system of a microlithographic projection exposure apparatus, that includes a beam deflection array including a number of reflective or transparent beam deflection elements, wherein each beam deflection element is adapted to deflect an impinging light beam by a deflection angle that is variable in response to control signals, a system pupil surface, in which light beams reflected from the beam deflection elements illuminate spots, wherein the number of spots illuminated in the system pupil surface during an exposure process, during which a mask is imaged on a light sensitive surface, is greater than the number of beam deflection elements.

Embodiments of the illumination system can include one or more features of other aspects.

BRIEF DESCRIPTION OF THE DRAWINGS

Various features and advantages may be more readily understood with reference to the following detailed description taken in conjunction with the accompanying drawing in which:

FIG. 18 is a meridional section through an embodiment of a beam splitting unit in which an irradiance distribution formed in an intermediate pupil surface is multiplied and then imaged on the system pupil surface;

FIG. 19 shows an irradiance distribution in the intermediate pupil surface produced by the beam splitting unit shown in FIG. 18;

FIG. 20 shows an irradiance distribution in the system pupil surface produced by the beam splitting unit shown in FIG. 18;

FIGS. 27a and 27b show two second exemplary partial irradiance distributions, which are successively produced in a system pupil surface;

FIGS. 28a and 28b show two third exemplary partial irradiance distributions, which are successively produced in a system pupil surface.

DETAILED DESCRIPTION

I

General Structure of Projection Exposure Apparatus

Figure 1:
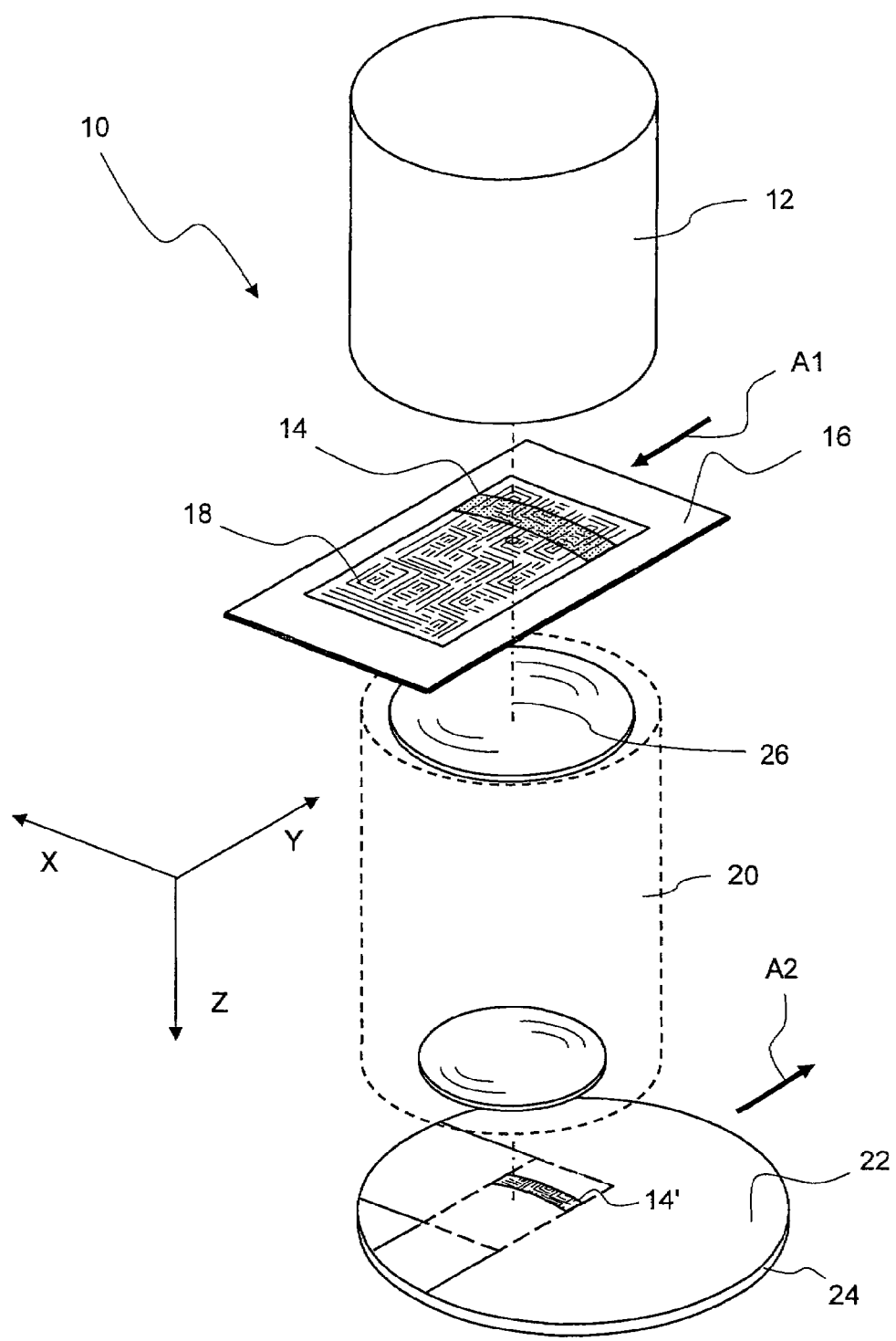
FIG. 1 is a perspective and considerably simplified view of an embodiment of a projection exposure apparatus.

FIG. 1 is a perspective and highly simplified view of a DUV projection exposure apparatus 10 that comprises an illumination system 12 for producing a projection light beam. The projection light beam illuminates a field 14 on a mask 16 containing minute structures 18. In this embodiment the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned by means of a mask stage (not shown) in an object plane of the projection objective 20. Since the latter has a magnification of less than 1, a minified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan apparatus" or simply a "scanner". The ratio between the velocities of the mask 16 and the substrate 24 is equal to the magnification of the projection objective 20. If the projection objective 20 inverts the image, the mask 16 and the substrate 24 move in opposite directions, as this is indicated in FIG. 1 by arrows A1 and A2. However, stepper tools in which the mask 16 and the substrate 24 do not move during projection of the mask may also be used.

In the embodiment shown, the illuminated field 14 is not centered with respect to an optical axis 26 of the projection objective 20. Such an off-axis illuminated field 14 may be necessary with certain types of projection objectives 20. In other embodiments, the illuminated field 14 is centered with respect to the optical axis 26.

EUV projection exposure apparatus have the same basic structure. However, because there are no optical materials that are transparent for EUV radiation, only mirrors are used as optical elements, and also the mask is of the reflective type.

II

General Structure of Illumination System

Figure 2:
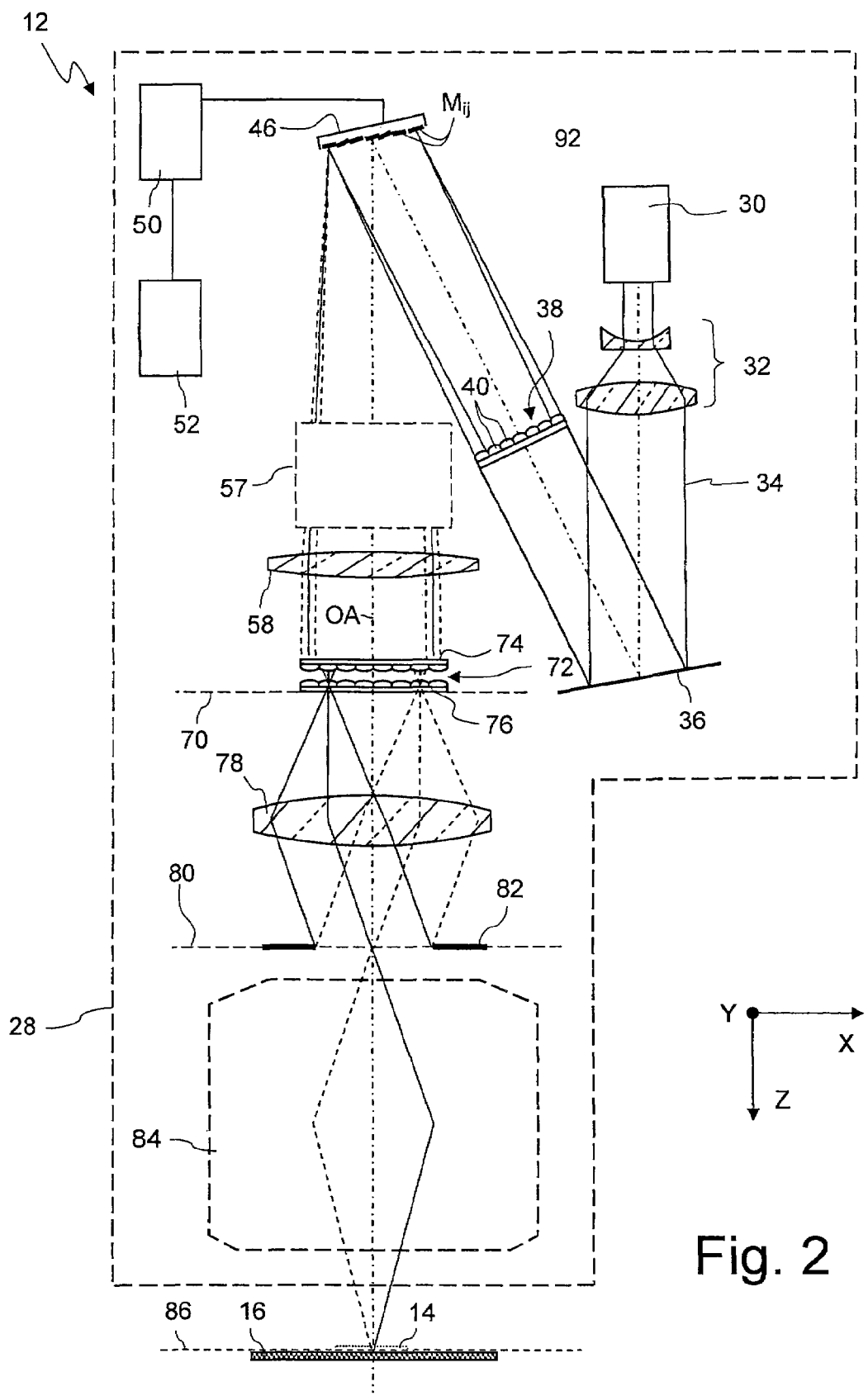
FIG. 2 is a meridional section through an illumination system contained in the projection exposure apparatus shown in FIG. 1.

FIG. 2 is a more detailed meridional section through the DUV illumination system 12 shown in FIG. 1. For the sake of clarity, the illustration of FIG. 2 is considerably simplified and not to scale. This particularly implies that different optical units are represented by very few optical elements only. In reality, these units may comprise significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wavelengths, for example 248 nm or 157 nm, are also contemplated.

In the embodiment shown, the projection light emitted by the excimer laser 30 enters a beam expansion unit 32 in which the light beam is expanded without altering the geometrical optical flux. The beam expansion unit 32 may comprise several lenses as shown in FIG. 2, or may be realized as a mirror arrangement, for example. The projection light emerges from the beam expansion unit 32 as a substantially collimated beam 34. In other embodiments, this beam may have a significant divergence. The collimated beam 34 impinges on a plane folding mirror 36 provided for reducing the overall dimensions of the illumination system 12.

After reflection from the folding mirror 36, the beam 34 impinges on an array 38 of microlenses 40. A mirror array 46 is arranged in or in the vicinity to a back focal plane of the microlenses 40. As will be explained in more detail below, the mirror array 46 comprises a plurality of small individual mirrors $M_{ij}$ that can be tilted, independently from each other, by two tilt axes that are preferably aligned perpendicularly to each other. The total number of mirrors $M_{ij}$ may exceed 100 or even several 1000. The reflecting surfaces of the mirrors $M_{ij}$ may be plane, but could also be curved, if an additional reflective power is desired. Apart from that, the mirror surfaces may support diffractive structures. In this embodiment the number of mirrors $M_{ij}$ is equal to the number of microlenses 40 contained in the microlens array 38. Thus each microlens 40 directs a converging light beam on one mirror $M_{ij}$ of the mirror array 46.

The tilting movements of the individual mirrors $M_{ij}$ are controlled by a mirror control unit 50 which is connected to an overall system control 52 of the illumination system 12. Actuators that are used to set the desired tilt angles of the mirrors $M_{ij}$ receive control signals from the mirror control unit 50 such that each individual mirror $M_{ij}$ is capable of reflecting an impinging light ray by a reflection angle that is variable in response to the control signal. In the embodiment shown there is a continuous range of tilt angles at which the individual mirrors $M_{ij}$ can be arranged. In other embodiments, the actuators are configured such that only a limited number of discrete tilt angles can be set.

Figure 3:
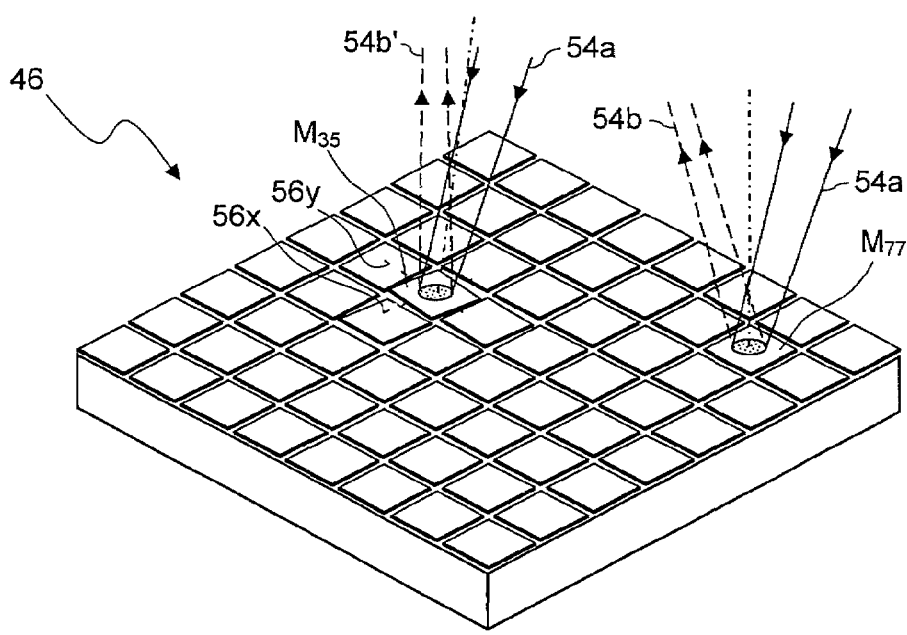
FIG. 3 is a perspective view of a mirror array contained in the illumination system of FIG. 2.

FIG. 3 is a perspective view of the mirror array 46 comprising, for the sake of simplicity, only 8·8=64 mirrors $M_{ij}$. Light beams 54a impinging on the mirror array 46 are reflected to different directions depending on the tilt angles of the mirrors $M_{ij}$. In this schematic representation it is assumed that a particular mirror $M_{35}$ is tilted about two tilt axes 56x, 56y relative to another mirror $M_{77}$ so that the light beams 54b, 54b' which are reflected by the mirrors $M_{35}$ and $M_{77}$, respectively, are reflected into different directions.

Referring again to FIG. 2, the light beams reflected from the mirror $M_{ij}$ impinge on a beam multiplier unit 57 in which the number of light beams is increased, as is indicated in FIG. 2. Various embodiments of the beam multiplier unit 57 will be explained in more detail below. The light beams then pass, in the embodiment shown, through a first condenser 58 which ensures that the slightly diverging light beams impinge, now as at least substantially parallel light beams, on an optical integrator 72 which produces a plurality of secondary light sources. The optical integrator 72 increases the range of angles formed between the light rays and an optical axis OA of the illumination system 12. In other embodiments, the first condenser 58 is dispensed with so that the light beams impinging on the optical integrator 72 have a larger divergence. In still other embodiments the beam multiplier unit 57 is arranged between the first condenser 58 and the optical integrator 72.

The optical integrator 72 is realized, in the embodiment shown, as a fly's eye lens comprising two substrates 74, 76 that each includes two orthogonal arrays of parallel cylindrical microlenses. Other configurations of the optical integrator are envisaged as well, for example integrators comprising an array of microlenses that have rotationally symmetrical surfaces, but rectangular boundaries. Reference is made to WO 2005/078522 A, US 2004/0036977 A1 and US 2005/0018294 A1, in which various types of optical integrators suitable for the illumination system 12 are described.

Reference numeral 70 denotes a system pupil surface of the illumination system 12 that substantially defines the angular distribution of the light impinging on the mask 14. The system pupil surface 70 is usually plane or slightly curved and is arranged in or in immediate vicinity to the optical integrator 72. As the angular light distribution in the system pupil surface 70 directly translates into an intensity distribution in a subsequent field plane, the optical integrator 72 substantially determines the basic geometry of the illuminated field 14 on the mask 16. Since the optical integrator 72 increases the range of angles considerably more in the X direction than in the scan direction Y, the illuminated field 14 has larger dimensions along the X direction than along the scan direction Y.

The projection light emerging from the secondary light sources produced by the optical integrator 72 enters a second condenser 78 that is represented in FIG. 2 by a single lens only for the sake of simplicity. The second condenser 78 ensures a Fourier relationship between the system pupil surface 70 and a subsequent intermediate field plane 80 in which a field stop 82 is arranged. The second condenser 78 superimposes the light bundles, which are produced by the secondary light sources, in the intermediate field plane 80, thereby achieving a very homogenous illumination of the intermediate field plane 80. The field stop 82 may comprise a plurality of movable blades and ensures sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16.

III

Beam Multiplier Unit

1. First Embodiment

Figure 4:
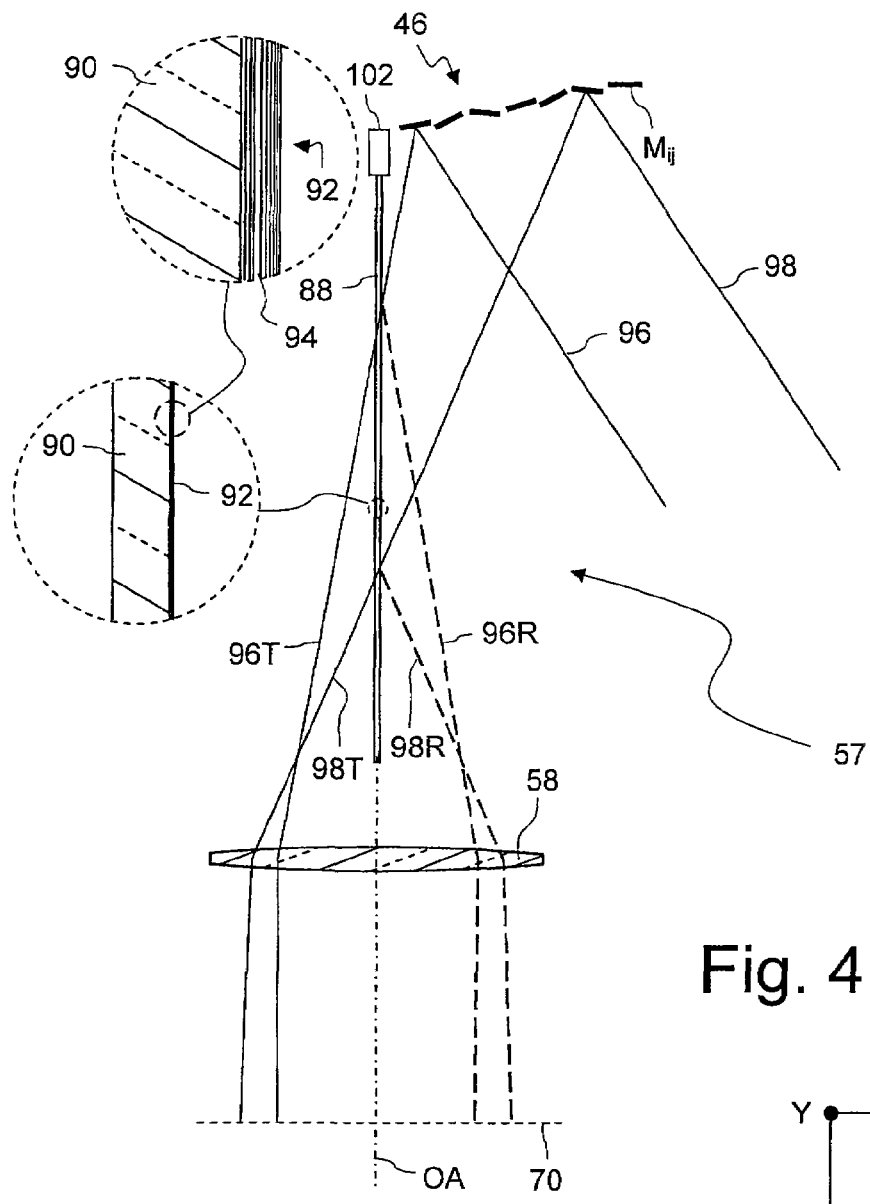
FIG. 4 is a meridional section through an embodiment of a beam splitting unit which includes a plane beam splitting surface.

FIG. 4 is an enlarged cutout from FIG. 2 showing a beam multiplier unit 57 according to a first embodiment in a meridional section. As it is also shown in FIG. 2, the beam multiplier unit 57 is arranged in the light path between the mirror array 46 and the first condenser 58, the latter being arranged at some distance in front of the system pupil surface 70. In this embodiment the beam multiplier unit 57 comprises a beam splitter 88 formed by a thin support plate 90 having planar plane surfaces and a beam splitting coating 92 applied on one of these surfaces. The beam splitting coating 92 is formed in this embodiment by a stack of thin dielectric layers 94 having alternating indices of refraction. The indices of refraction and the layer thicknesses are determined such that the beam splitting coating 92 has, for the projection light produced by the light source 30, a transmittance T and a reflection R with T=R≈50%. In other embodiments the T/R ratio may be distinct from 1.

The beam splitter 88 extends in a plane which contains the optical axis OA of the illumination system 12. The optical axis OA is the axis of rotational symmetry of the lenses and other rotationally symmetrical optical elements of the illumination system 12.

For the sake of simplicity the light beams produced by the microlenses 40 of the array 38 and directed towards the mirrors $M_{ij}$ will be represented in the following only by their principal rays. In FIG. 4 two such light beams 96, 98 are reflected from mirrors $M_{ij}$ of the array 46 and impinge on the beam splitter 88. At the beam splitting coating 92 the light beams 96, 98 are split into two partial light beams 96T, 96R and 98T, 98R, respectively. Apart from a small displacement resulting from refraction at the support plane 90, the transmitted partial light beams 96T, 98T are extensions of the incoming light beams 96 and 98, respectively. The propagation directions of the reflected partial light beams 96R, 98R are determined by the law of reflection, i.e., the angle of reflection equals the angle of incidence in the plane of incidence. The transmitted and reflected partial light beams 96T, 98T, 96R, 98R then propagate through the first condenser 58 and intersect the system pupil surface 70.

Figure 5:
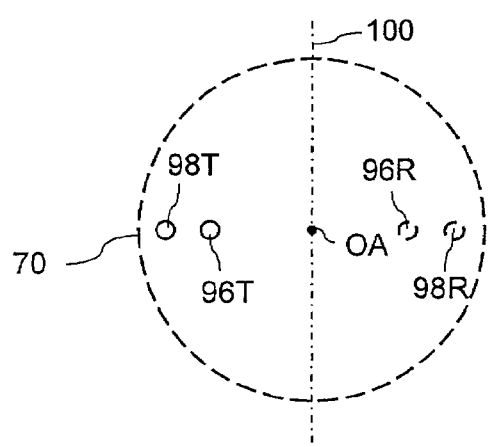
FIG. 5 shows an irradiance distribution in the system pupil surface produced by the beam splitting unit shown in FIG. 4.

FIG. 5 illustrates the intensity distribution that is obtained under the conditions shown in FIG. 4 in the system pupil surface 70. It can be seen that the reflected partial light beams 96R, 98R produce spots in the system pupil surface 70 which are arranged mirror-symmetrically with regard to the spots produced by the transmitted partial light beams 96T, 98T, with 100 denoting the plane of symmetry in the system pupil surface 70. This is a result of the planar configuration of the beam splitting coating 92. Since the beam splitter 88 contains the optical axis, the symmetry plane 100 in the system pupil surface 70 also contains the optical axis OA.

The beam multiplier unit 57 thus makes it possible to produce from each incoming light beam 96, 98 a pair of exit light beams that illuminate spots in the system pupil surface 70 being arranged mirror-symmetrically with regard to the symmetry plane 100. By tilting a particular mirror $M_{ij}$ of the array 46, it is thus possible to move a pair of spots in the system pupil surface 70 which always remain their mirror symmetry with regard to the symmetry plane 100. For example, if the spot produced by the transmitted partial light beam 96T is moved towards the optical axis OA, the symmetrical spot produced by the partial light beam 96R will move towards the optical axis OA, too.

More generally speaking, the beam multiplier unit 57 according to this embodiment makes it possible to produce 2N light spots in the system pupil surface 70 with only N mirrors $M_{ij}$. This effect can be exploited to reduce the total number of mirrors $M_{ij}$ in comparison to existing illumination systems whilst keeping the number of spots in the system pupil surface 70 (referred to in the following as setting resolution) the same. Alternatively, the number of mirrors $M_{ij}$ is kept the same as in existing systems, and the setting resolution is doubled.

The beam multiplier unit 57 shown in FIG. 4 is ideally suited for producing illumination settings having a mirror symmetry. Most of the usual illumination settings, namely conventional, annular, dipole and quadrupole illumination settings, have such a mirror symmetry. If the symmetry plane 100 in the system pupil surface 70 shall be changed, the beam splitter 88 may be coupled to an actuator 102. The actuator 102 is configured to rotate the beam splitter 88 around a rotational axis that coincides with the optical axis OA. By rotating the beam splitter 88 by 90°, the symmetry plane 100 in the system pupil surface 70 will also be tilted by 90°.

Another advantage of the beam multiplier unit 57 is that smaller tilt angles of the mirror $M_{ij}$ can be used to illuminate any arbitrary location in the system pupil surface 70. Smaller tilt angles simplify the construction and control of the mirrors $M_{ij}$.

2. Second Embodiment

Figure 6:
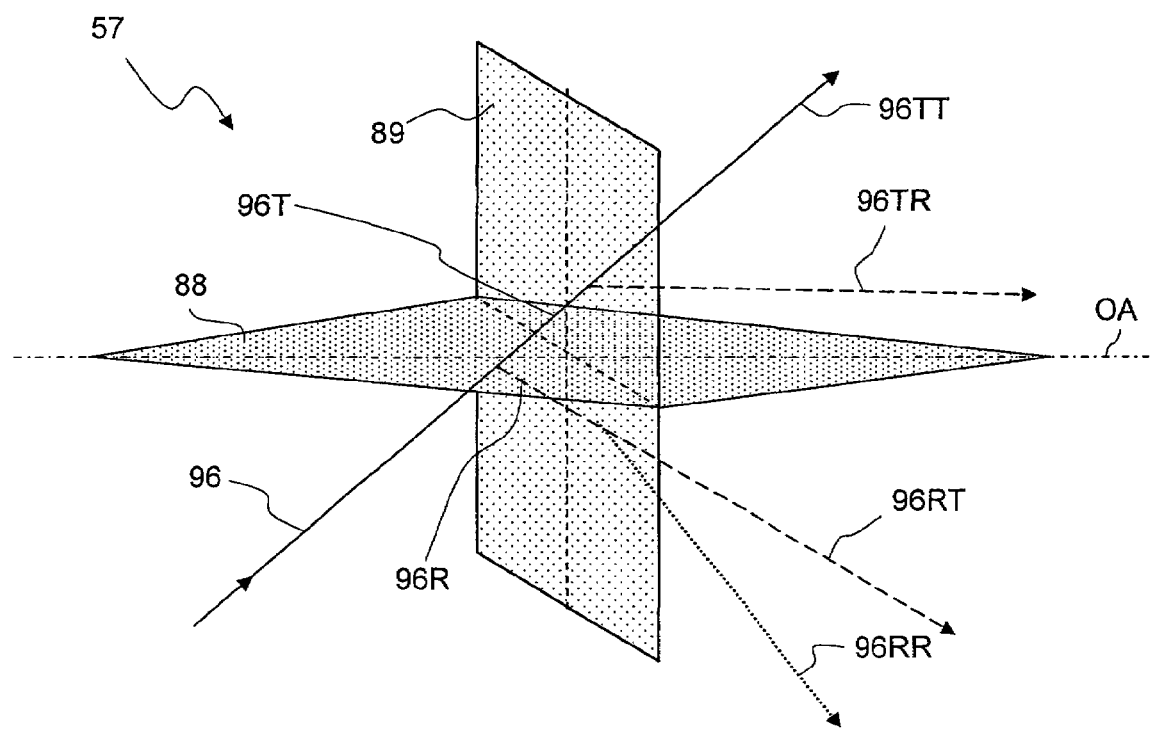
FIG. 6 is a perspective view of an embodiment of a beam splitting unit which includes two orthogonal plane beam splitting surfaces.

FIG. 6 is a perspective view of a beam multiplier unit 57 according to a second embodiment. This embodiment differs from the embodiment shown in FIG. 4 in that the beam multiplier unit 57 comprises a second beam splitter 89 which has the same general structure as the first beam splitter 88, but is arranged perpendicular to the optical axis OA. The two beam splitters 88, 89 therefore form a right angle in between, with the optical axis OA running through the line where the planes, in which the beam splitters 88, 89 are arranged, intersect.

Figure 7:
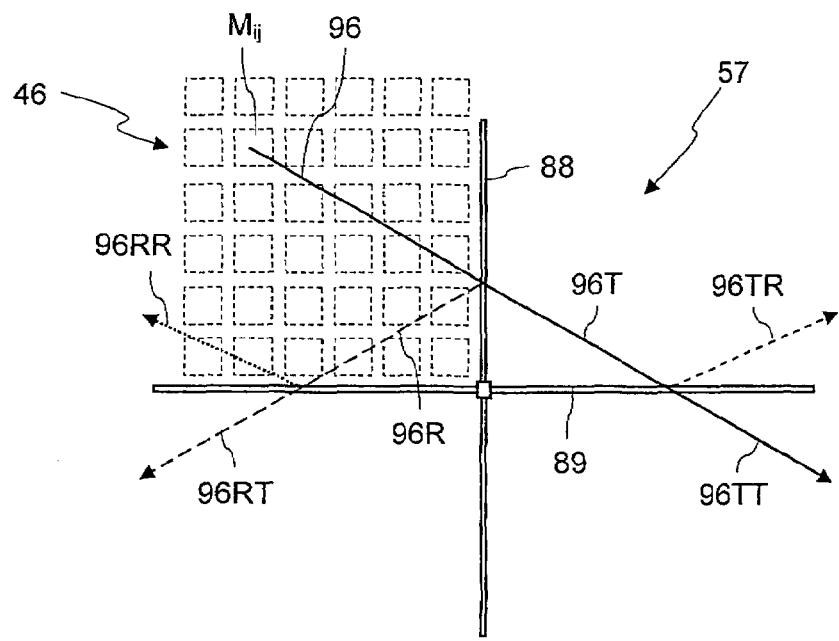
FIG. 7 is a top view on the beam splitting unit shown in FIG. 6.

FIG. 7 is a top view on the beam multiplier unit 57 along the Z direction which is assumed to be parallel to the optical axis OA. In this top view it can be seen that the beam splitters 88, 89 define four quadrants, with the mirror array 46 being arranged in one of them. As a result of this arrangement, each light beam reflected from a mirror $M_{ij}$ impinges twice on beam splitters, namely first on the first beam splitter 88 and then on the second beam splitter 89, or vice versa. In FIG. 7 it is assumed that a light beam 96 reflected from a mirror $M_{ij}$ impinges first on the first beam splitter 88 and is split into a transmitted partial light beam 96T and a reflected partial light beam 96R. The transmitted partial light beam 96T impinges on the second beam splitter 89 and is split into a reflected partial light beam 96TR and a transmitted partial light beam 96TT.

The reflected partial light beam 96R which has been produced by the first beam splitter 88 impinges on the second beam splitter 89 and is split into a transmitted partial light beam 96RT and a reflected partial light beam 96RR. As a result, the incoming light beam 96 is split into four partial light beams 96TT, 96TR, 96RT and 96RR.

Figure 8:
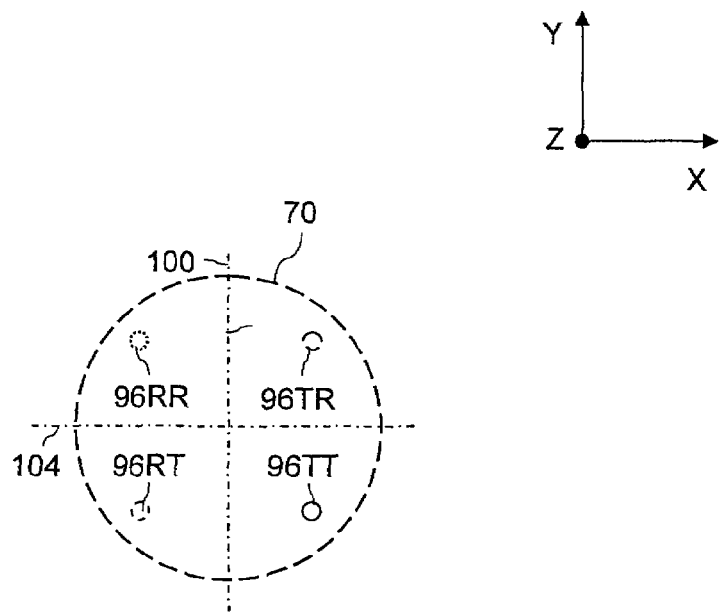
FIG. 8 shows an irradiance distribution in the system pupil surface produced by the beam splitting unit shown in FIGS. 6 and 7.

FIG. 8 illustrates the irradiance distribution obtained in the system pupil plane 70 in a representation similar to FIG. 5. The spot produced by the twice transmitted partial light beam 96TT, i.e. a light beam which would be present also in the absence of the beam multiplier unit 57, is positioned in one quadrant of the system pupil surface 70 defined by perpendicular first and second planes of symmetry 100 and 104, respectively. The beam multiplier unit 57 produces three additional spots, which are illuminated by the partial light beams 96TR, 96RT and 96RR, in the remaining three quadrants of the system pupil surface 70. The four spots in the system pupil surface illustrated in FIG. 8 are arranged mirror-symmetrically with regard to the first and second planes of symmetry 100, 104. If the mirror $M_{ij}$, from which the light beam 96 is reflected, is tilted such that the spot produced by the partial light beam 96TT moves towards the optical axis OA, the other three spots will move towards the optical axis OA as well, whilst maintaining their mirror symmetric arrangement.

Similar to the first embodiment shown in FIG. 4, the position of the first and second planes of symmetry 100, 104 may be changed by changing the position of the first and second beam splitter 88 and 89, respectively. Holders for the beam splitters 88 and/or 89 may be displaceable along at least one direction perpendicular to the optical axis OA. In other embodiments at least one of the beam splitters 88, 89 is configured to be rotated about an axis coinciding with or extending parallel to the optical axis OA. In either case the adjustability of one of both beam splitters 88, 89 makes it possible to produce irradiance distributions in the system pupil surface 70 having different mirror symmetries.

Figure 9:
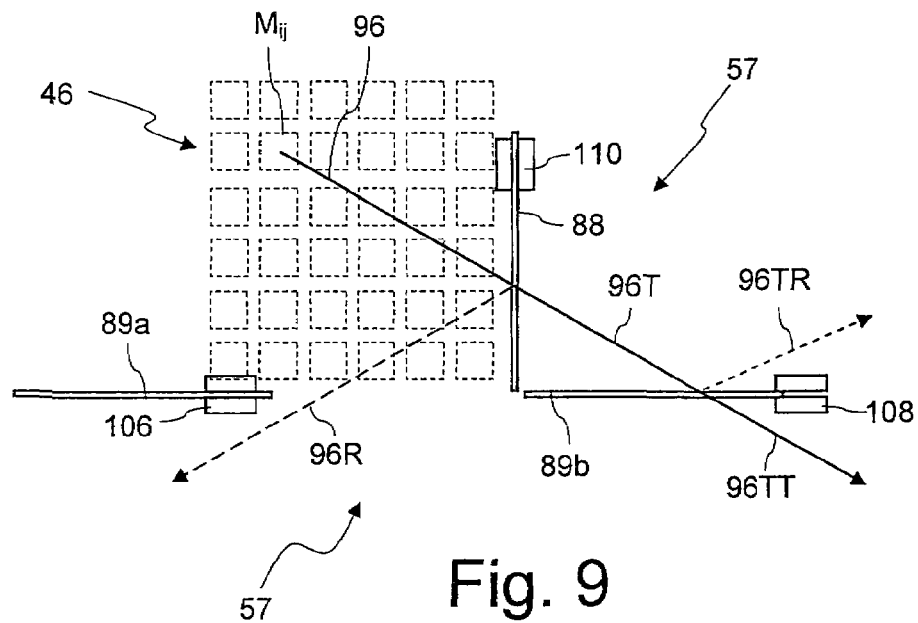
FIG. 9 is a top view similar to FIG. 7 of another embodiment in which a beam splitting surface can be removed from the light path.
Figure 10:
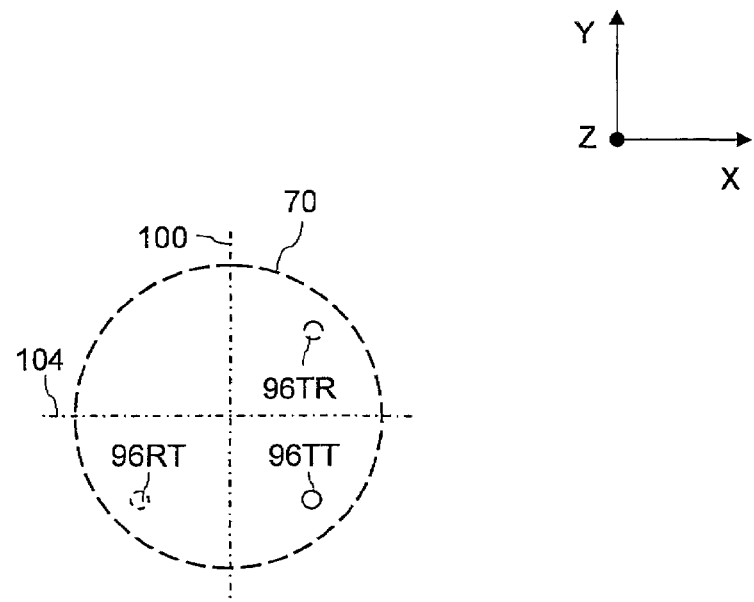
FIG. 10 shows an irradiance distribution in the system pupil surface produced by the beam splitting unit shown in FIG. 9.

FIGS. 9 and 10 illustrate an embodiment in which the second beam splitter comprises two portions 89a, 89b which can be individually removed from the light propagation path with the help of actuators 106, 108. A similar actuator 110 is provided for removing the first beam splitter 88 from the light propagation path. In the configuration shown in FIG. 9 it is assumed that the actuator 106 has been operated so that the left portion 89a of the second beam splitter is removed and thus no longer exposed to any of the light beams.

FIG. 10 shows the irradiance distribution that is obtained under such conditions in the system pupil surface 70 in a representation similar to FIG. 8. Compared to the irradiance distribution shown in FIG. 8, the spot produced by the partial light beam 96RR is missing. Additionally, the spot produced by the only once reflected partial light beam 96R has twice the irradiance of the spots produced by the partial light beams 96TT and 96TR, provided that also in this embodiment all beam splitters 88, 89 having a transmittance T which equals the reflectance R.

Furthermore it has been assumed in the embodiment shown in FIG. 9 that the mirrors $M_{ij}$ are controlled such that all light beams reflected from the mirrors $M_{ij}$ first impinge on the first beam splitter 88. Then the lower portion of the first beam splitter 88 shown in FIG. 7 can be dispensed with.

Figure 11:
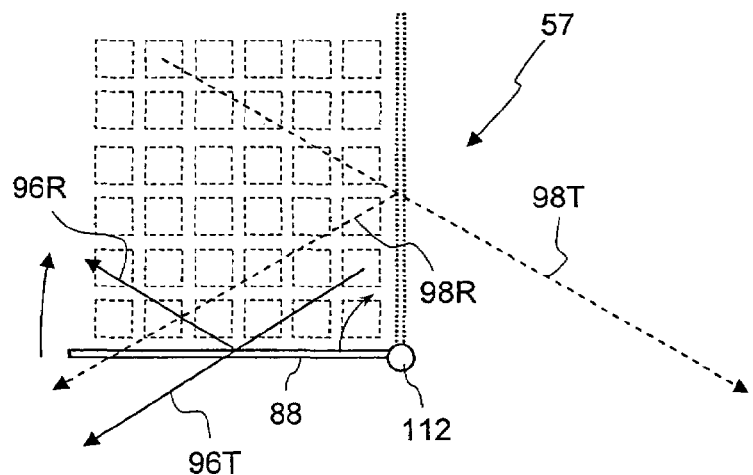
FIG. 11 is a top view similar to FIG. 9 of another embodiment in which a beam splitting surface can be rotated.
Figure 12:
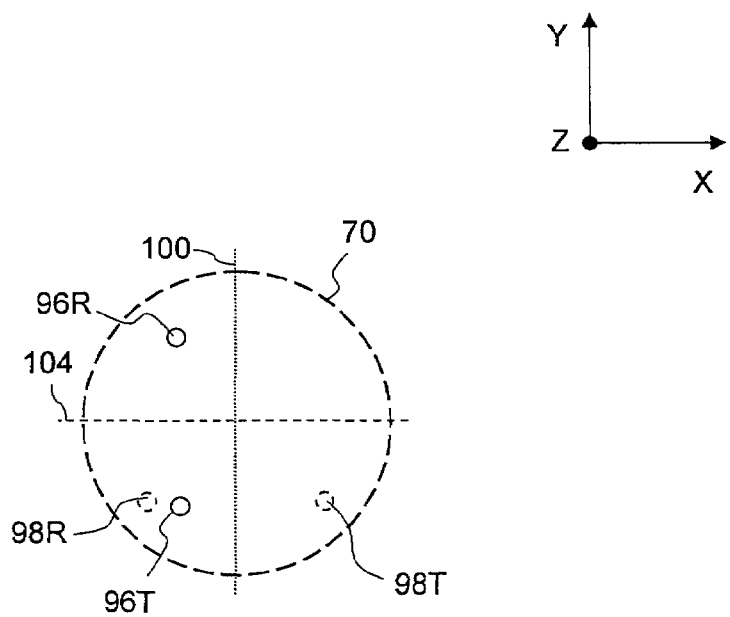
FIG. 12 shows an irradiance distribution in the system pupil surface produced by the beam splitting unit shown in FIG. 11 in two different positions of the beam splitting surface.

FIG. 11 shows a further alternative embodiment of a beam multiplier unit 57 comprising only a single beam splitter 88 which can be rotated around the optical axis OA with the help of an actuator 112. If the beam splitter 88 is rotated from the position shown with solid lines in FIG. 11 to the position indicated with dotted lines such that it extends parallel to the YZ plane, the plane of symmetry 104 in the system pupil surface 70 changes to the plane of symmetry 100 extending parallel to the YZ plane, as is indicated in FIG. 12. This change of the plane of symmetry is indicated in FIG. 12 for partial light beams 96T, 96R (for the beam splitter 88 extending in the XZ plane) and the partial light beams 98T, 98R (for the rotated beam splitter 88 extending in the YZ plane).

3. Third Embodiment

Figure 13:
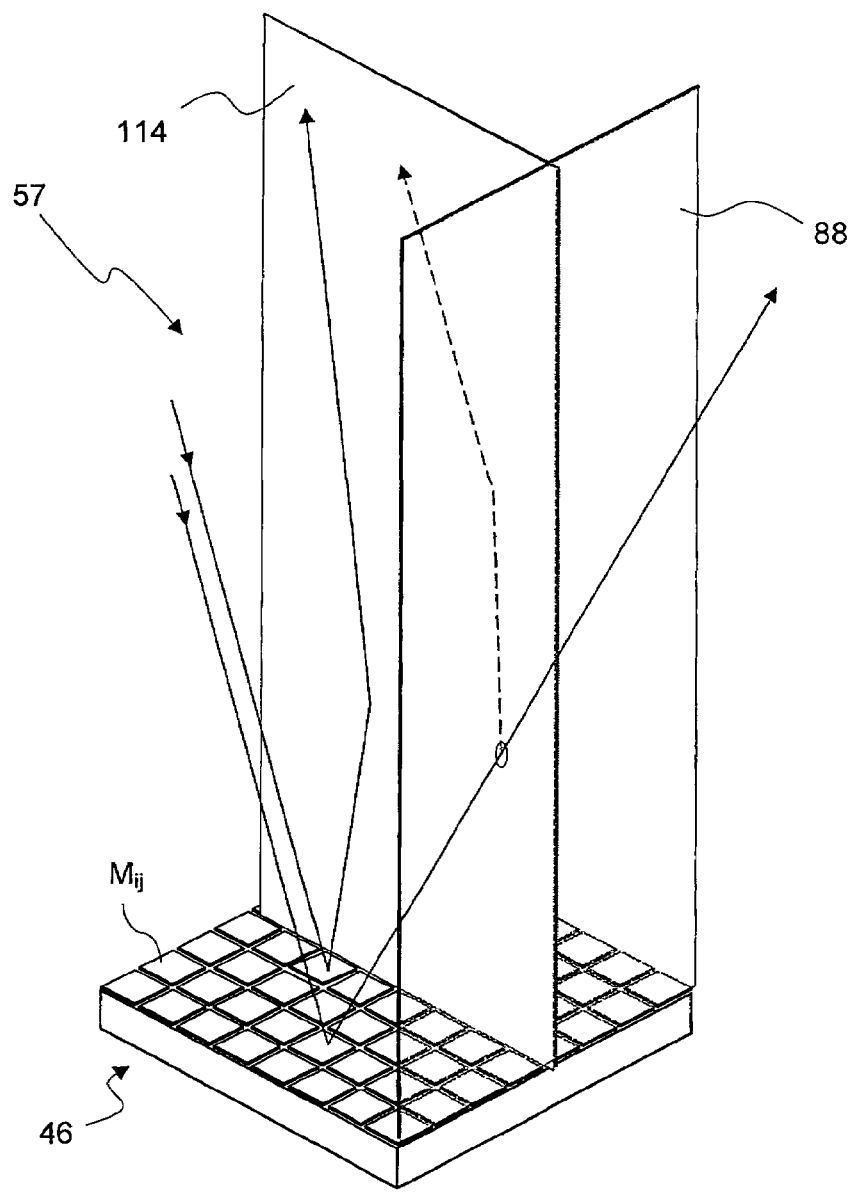
FIG. 13 is a perspective view of an embodiment of a beam splitting unit including a plane beam splitting surface and a plane mirror.

FIG. 13 is a perspective view on the mirror array 46 and a beam multiplier unit 57 according to a third embodiment. The beam multiplier unit 57 shown in FIG. 13 differs from the beam multiplier unit shown in FIG. 4 namely in that an additional plane mirror 114 is provided. The mirror 114 has a reflectance R close to 100% and is arranged parallel to the optical axis OA, but perpendicular to the beam splitter 88, thereby dividing the mirror array 46 in two halves of equal size.

Figure 14:
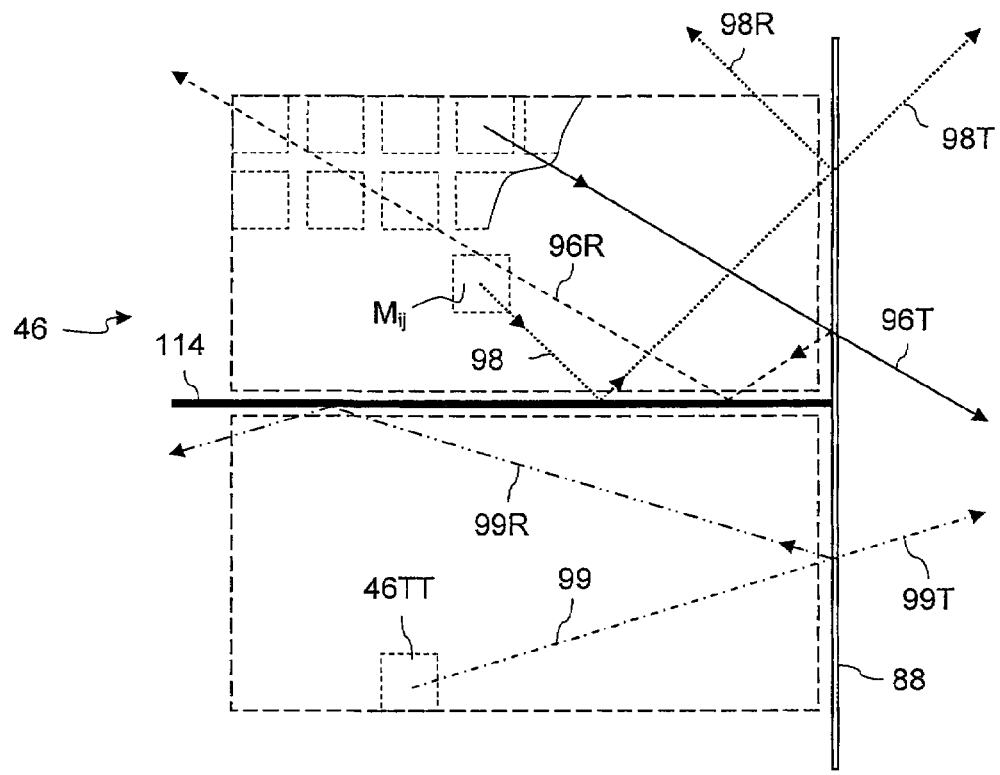
FIG. 14 is a top view similar to FIG. 7 on the beam splitting unit shown in FIG. 13.

FIG. 14 is a top view on the arrangement shown in FIG. 13 along the direction Z direction which runs parallel to the optical axis OA. A light beam 96 impinging first on the beam splitter 88 will be split into a transmitted partial light beam 96T and a reflected partial light beam 96R. The reflected partial light beam 96R impinges on the mirror 114 so that it leaves the beam multiplier unit 57 diametrically opposed with respect to the transmitted partial light beam 96T.

Figure 15:
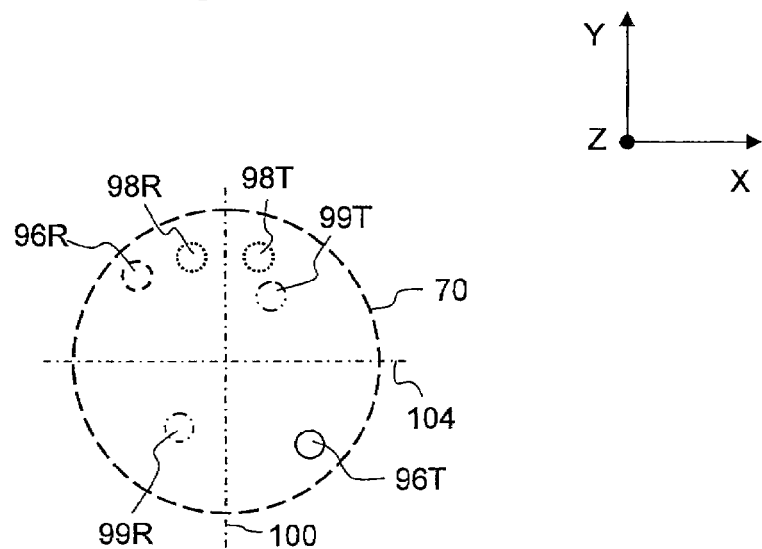
FIG. 15 shows an irradiance distribution in the system pupil surface produced by the beam splitting unit shown in FIGS. 13 and 14.

In the system pupil surface 70 shown in FIG. 15 the spots produced by the transmitted and reflected partial light beams 96T, 96R are therefore arranged point-symmetrically, with the optical axis OA defining the axis of symmetry.

The same also applies to a light beam 99 which has been reflected from the mirror $M_{ij}$ in the other half of the mirror array 46, but directing the light beam 99 again towards the beam splitter 88 so that it is split into two partial light beams 99T, 99R. Also the spots produced by these partial light beams 99T, 99R are arranged point-symmetrically in the system pupil surface 70.

However, if a mirror $M_{ij}$ reflects a light beam 98 such that it impinges first on the mirror 114, the reflected light beam 98 impinges on the beam splitter 88 such that the partial light beam 98R reflected at the beam splitter 88 does not impinge on the mirror 114. As a result, the partial light beams 98T, 98R produce spots in the system pupil plane 70 which are not arranged point-, but mirror-symmetrically, with the plane of symmetry again denoted by 100 in FIG. 15.

Thus the beam multiplier unit 57 of this embodiment makes it possible to produce irradiance distributions in the system pupil surface 70 which do not have to be completely mirror-symmetric or point-symmetric, but may include portions having point-symmetry and other portions having mirror-symmetry. This broadens the range of irradiance distributions that can be produced with the help of the beam multiplier unit 57.

Figure 16:
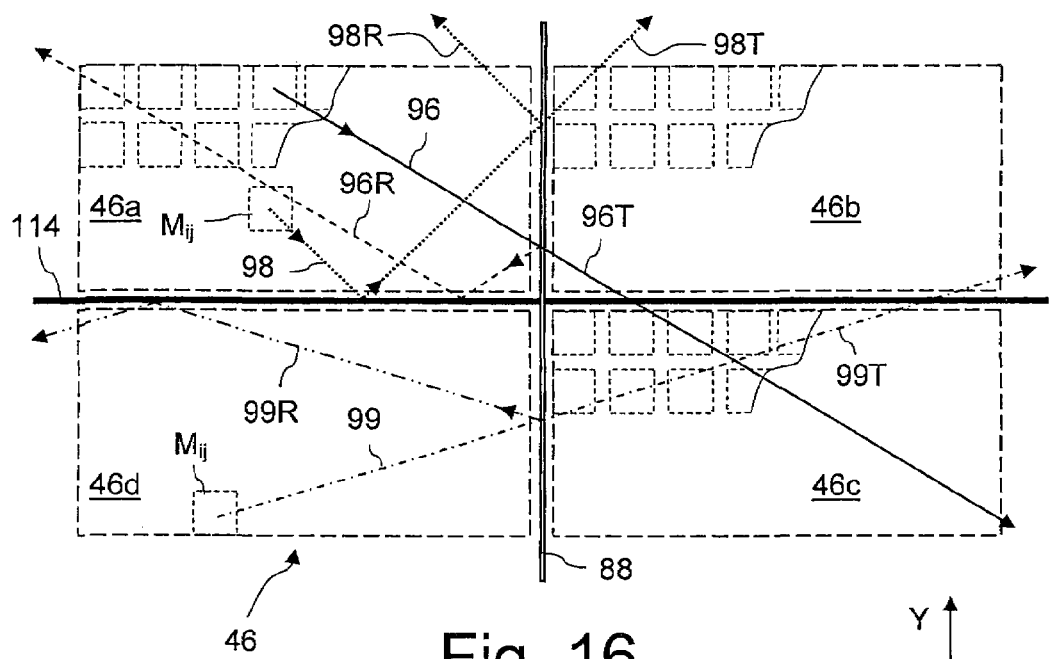
FIG. 16 is a top view similar to FIG. 14 of another embodiment in which the beam splitting surface and the plane mirror divide the mirror array into four quadrants.

FIG. 16 is a top view on a beam multiplier unit 57 according to another alternative embodiment. Here the beam splitter 88 and the mirror 114 intersect each other, which results in a cross-like arrangement if viewed along the Z direction top. The planes, in which the beam splitter 88 and the mirror 114 extend, intersect along a line which coincides with the optical axis OA and is centered with respect to the mirror array 46. Thus the beam multiplier unit 57 of this embodiment divides the mirror array 46 not only in two halves, as it is the case in the embodiment shown in FIGS. 13 and 14, but in four quadrants 46a, 46b, 46c and 46d of preferably equal size. Thus a highly symmetric layout is achieved.

In this embodiment it may be necessary to design the mirror 114 with a reduced dimension along the Z direction in comparison to the beam splitter 88. This ensures that the transmitted partial light beams 96T, 99T are not reflected again at an upper portion of the mirror 114.

Figure 17:
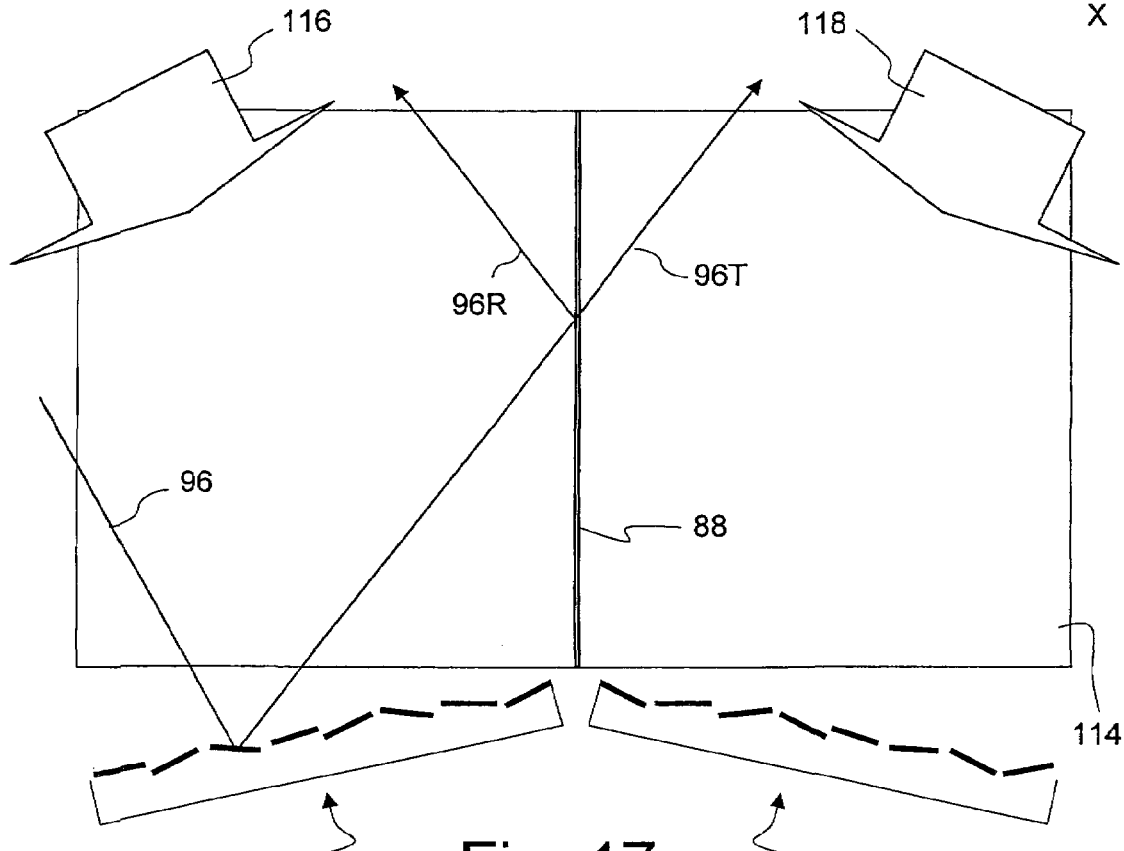
FIG. 17 is a side view of the embodiment shown in FIG. 16.

FIG. 17 is a side view of the alternative embodiment shown in FIG. 16. As can be seen, the four quadrants 46a, 46b, 46c and 46d of the mirror array 46 are arranged in an inclined manner with respect to each other. Each quadrant 46a, 46b, 46c and 46d is individually illuminated with light beams having different offset directions, as is indicated by arrows 116, 118 in FIG. 17. Additional optics are required in the illumination system 12 to achieve this illumination of the quadrants 46a, 46b, 46c and 46d with light beams having different offset angles.

In all embodiments described above it has been assumed that the transmittance T of the beam splitters 88 and/or 89 is equal to their reflectance R. This ensures that the spots illuminated by the light beams in the system pupil surface 70 have equal irradiance, too. However, it may also be envisaged to deliberately depart from this condition so that the multiplied spots have different irradiances. This may be advantageous for example, in the embodiments shown in FIGS. 13 to 17, in which light beams reflected from different mirrors $M_{ij}$ can be directed towards the same location in the system pupil surface 70. If the T/R ratio of the beam splitters 88 is distinct from 1 in different portions of the beam splitter 88, this provides a degree of freedom to perform fine adjustments of the irradiance distribution in the system pupil surface 70.

The embodiments shown in FIGS. 6 to 17 are particularly suited also for EUV illumination systems. A EUV beam splitter may be realized as a reflective diffractive element which diffracts an incoming beam at least along to different directions. For example, such a diffractive element may be designed such that all diffraction orders other than 0, +1 and −1 are suppressed.

4. Fourth Embodiment

FIG. 18 is a meridional section through a beam multiplier unit 57 according to a fourth embodiment. Here the beam multiplier unit 57 includes an intermediate pupil surface 120 and an objective 122 which establishes an imaging relation between the intermediate pupil surface 120 and the subsequent system pupil surface 70. The intermediate pupil surface 120 is either directly illuminated by the mirrors $M_{ij}$ of the array 46, or an additional condenser 124 indicated in broken lines is used to translate the angles of the light beams reflected from the mirrors $M_{ij}$ into locations in the intermediate pupil surface 120.

The objective 122 comprises a first positive lens 126 and a second positive lens 128 having a focal length $f_1$ and $f_2$, respectively. The distance between the first lens 126 and the second lens 128 equals $f_1+f_2$, i.e. the back focal plane of the first lens 126 coincides with the front focal plane of the second lens 128 in an aperture plane 129. The objective 122 is therefore telecentric both on the object and the image side so that the principal rays on the object and the image side run parallel to the optical axis OA. The intermediate pupil surface 120 is arranged in a front focal plane of the first lens 126, and the system pupil plane is arranged in a back focal plane of the second lens 128. It is to be understood that the first and second lens 126, 128 may be replaced in other embodiments by objectives comprising two or more lenses or other optical elements.

In the aperture plane 129 a polarization dependent beam splitter 130 is arranged. The polarization dependent beam splitter 130 is configured such that it has a transmittance T of nearly 100% for a first state of polarization and a reflectance R of nearly 100% for a second state of polarization which is orthogonal to the first state of polarization. In the embodiment shown the polarization dependent beam splitter 130 is configured such that p-polarized light indicated with double arrows is transmitted, whereas s-polarized light, which is indicated with a dot centered in a circle, is reflected.

In one half of the intermediate pupil surface 120 a plane mirror 132 is arranged which may have the contour of a ring segment. In the light path between the polarization dependent beam splitter 130 and the mirror 132 a quarter-wave plate 134 is arranged. Between the second lens 128 and the system pupil surface 70 there is, in the embodiment shown, an optional retarder plate 136 which is configured to rotate the polarization direction of linearly polarized light. This rotating property may be locally varying over the surface of the retarder plate 136. Examples of such retarders are described in patent applications US 2002/0176166 A1 and US 2006/0055909 A1 (see FIG. 23).

The beam multiplier unit 57 functions as follows:

During operation, the mirrors $M_{ij}$ of the array 46 are tilted such that the reflected light beams 96 impinge on the optional condenser lens 124 and produce spots in the lower half of the intermediate pupil surface 120. An exemplary irradiance distribution produced by the light beams 96 in the intermediate pupil surface 120 is shown in FIG. 19. It is assumed that the light beams 96 are unpolarized when they pass through intermediate pupil surface 120. If this assumption is not fulfilled, an additional depolarizer may be arranged somewhere in the beam path in front of the polarization dependent beam splitter 130.

The light beams 96 having passed the first lens 126 converge towards the back focal point of the first lens 126 in which the polarization dependent beam splitter 130 is arranged. Here the s-polarized light portion of the light beams 96 is completely reflected towards the other half of the first lens 126. The reflected light beams 96R propagates through the quarter-wave plate 134 and impinge on the mirror 132. Since the mirror 132 is arranged in the front focal plane of the first lens 126, an image of the irradiance distribution in the lower half of the intermediate pupil surface 120 is produced in the upper half of the surface 120 where the mirror 132 is arranged. This image formed on the mirror 132 is mirror-symmetrical with regard to the irradiance distribution produced by the light beam 96 in the lower half of the intermediate pupil surface 120, as is illustrated also in FIG. 19.

The light beams 96R reflected from the mirror 132 take the same way back to the polarization dependent beam splitter 130, i.e. they pass the quarter-wave plate 134 and the first lens 126. Since the reflected light beams 96R pass the quarter-wave plate 134 twice, the state of polarization is converted from s-polarization to p-polarization. Due to this conversion of the state of polarization, the polarization dependent beam splitter 130 now transmits the reflected light beam 96R which then passes also through the second lens 128 and the optional retarder plate 136. Thus an image of the irradiance distribution formed on the mirror 132, which is itself an image of the irradiance distribution formed by the incoming light beams 96 in the lower half of the intermediate pupil surface 120.

Since each image is point-symmetrical with respect to the object, the irradiance distribution produced by the reflected light beams 96R in the lower half of the system pupil plane 70 is identical to the irradiance distribution in the lower half of the intermediate pupil surface 120 as it is produced by the incoming light beams 96. This is also illustrated in FIG. 20 showing the irradiance distribution in the system pupil surface 70 which is obtained with the exemplary irradiance distribution in the intermediate pupil surface 120 shown in FIG. 19.

The upper half of the irradiance distribution in the system pupil plane 70 is formed by the p-polarized the light beams 96T that have been transmitted by the beam splitter 130. This transmitted light beams 96T also pass through the second lens 128 and the optional retarder plate 136 and form a point-symmetrical image of the irradiance distribution produced by the light beams 96 in the lower half of the intermediate pupil surface 120.

The beam multiplier unit 57 therefore adds a point-symmetrical image of an irradiance distribution produced in one half of the intermediate pupil surface 120 on the other half, and then images this combined irradiance distribution on the system pupil surface 70. This image is magnified if the focal length $f_2$ of the second lens 128 is greater than the focal length $f_1$ of the first lens 126.

The effect produced by the beam multiplier unit 57 is thus different from the first embodiment shown in FIG. 4, because there the irradiance distribution added by the beam multiplier unit 57 is mirror-symmetrical, whereas the beam multiplier unit 57 of the fourth embodiment shown in FIG. 18 adds a point-symmetrical irradiance distribution.

The beam multiplier unit 57 shown in FIG. 18 has also the advantage that it is, as a kind of side effect, capable of producing (depending on the properties of the polarization dependent beam splitter 130) from incoming unpolarized light beams 96 either s- or p-polarized light beams 96R, 96T in the system pupil surface 70. From this defined state of polarization it is easy to produce almost any arbitrary linear polarization distribution with the help of the retarder plate 136.

Another advantage is that the beam multiplier unit 57 in fact multiplies an irradiance distribution produced in the intermediate pupil surface 120, and not only individual light beams. Thus using the beam multiplier unit 57 of this embodiment does not necessitate any redesign of the mirror array 46 and its control unit 50, as is the case with most of the embodiments described above.

For the embodiment shown in FIG. 18 a crucial element is the polarization dependent beam splitter 130. The polarization dependent beam splitting property can usually be achieved only for a restricted range of angles of incidence, for example angles between 50° and 70°. For an incoming light beam 96', which is indicated with a dotted line in FIG. 18 and which runs close to the optical axis OA of the objective 122, the polarization dependent beam splitting property of the splitter 130 may not be available. Therefore this embodiment is less suited for producing illumination settings in which a central region in the system pupil plane 70 is supposed to be illuminated.

5. Fifth Embodiment

Figure 21:
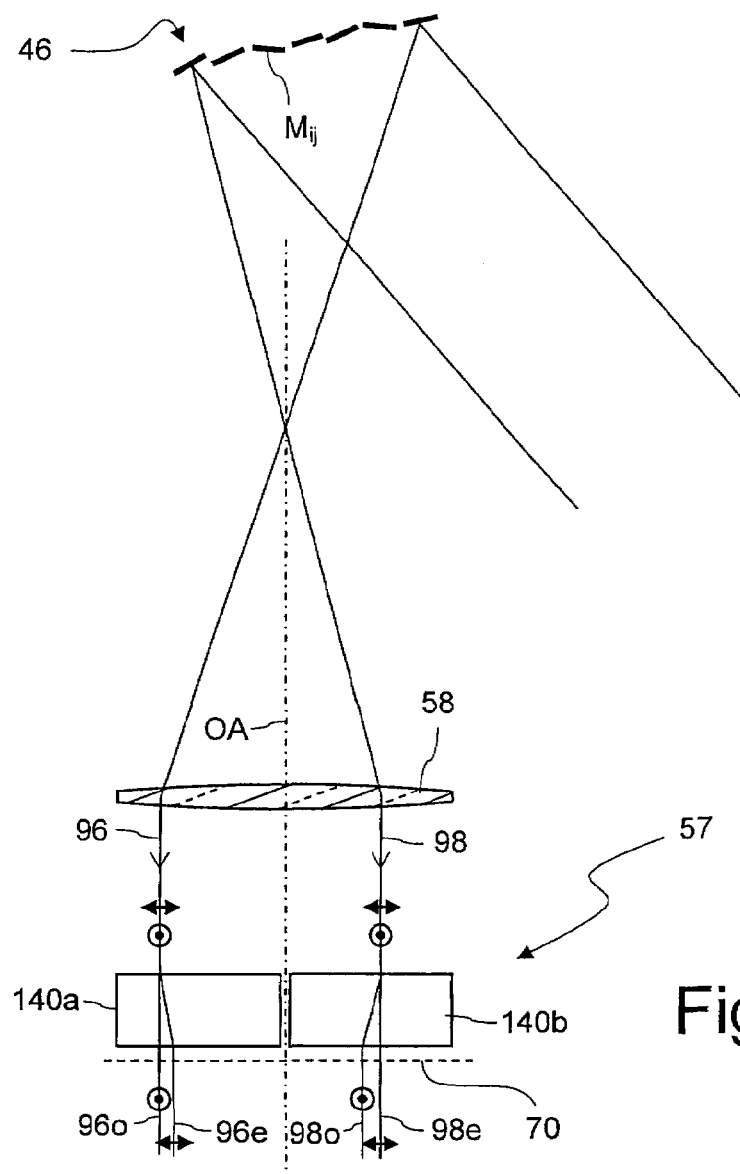
FIG. 21 is a meridional section through an embodiment of a beam splitting unit in which the beam splitting unit comprises birefringent elements.
Figure 22:
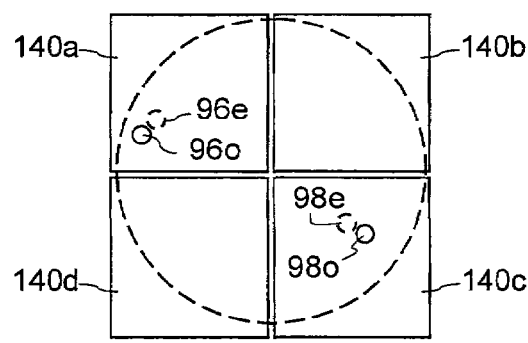
FIG. 22 is a top view on the beam splitting unit shown in FIG. 21.

FIG. 21 is a meridional section through a beam multiplier unit 57 according to a fifth embodiment. Here the beam multiplier unit 57 comprises a polarizing beam splitter which, in the embodiment shown, includes four plates 140a, 140b, 140c, 140d which are arranged in a regular pattern as is shown in the top view of FIG. 22. The plates 140a to 140d may be joined at their lateral faces seamlessly or, as shown in FIGS. 21 and 22, be spaced apart by a small gap.

Each of the plates 140a to 140d is made of a birefringent material so that it splits up incoming light beams 96, 98 into ordinary light beams 96o, 98o and extraordinary light beams 96e, 98e. The ordinary light beams 96o, 98o and the extraordinary light beams 96e, 98e have orthogonal states of polarization, as is indicated in FIG. 21 with the symbols that have been used also in FIG. 18. The distance between the emergent light beams 96o, 96e depends, among others, on the thickness of the plates 140a to 140d along the direction defined by the optical axis OA. In the embodiment shown all plates 140a to 140d have the same thickness, but the slow birefringent axis of the birefringent material of each plate 140a to 140d is oriented differently. Thus the spots produced by the extraordinary light beams 96e, 98e are arranged at equal distances from the spots produced by the ordinary light beams 96o and 98o, respectively, but at different angular orientations.

Additional polarization manipulating means, for example a quarter-wave plate, may be used to produce light having a uniform state of polarization across the entire system pupil surface 70.

IV

Beam Multiplication in Time Domain

In all embodiments described above the number of spots in the system pupil surface produced by light beams during an exposure process is greater than the number of mirrors $M_{ij}$ of the array 46. This applies for any given instant during an exposure process in which the mask 16 is imaged on the light sensitive surface 22.

However, for a successful exposure process it is not necessary that an arbitrary point on the mask 16 is illuminated from all desired directions at the same time. Instead, it is sufficient that after completion of the exposure process each point on the mask 16 has been illuminated with projection light from all desired directions. In other words, the multiplication of spots produced in the system pupil surface 70 may also take place chronologically, i.e. in the time domain.

Figure 23A:
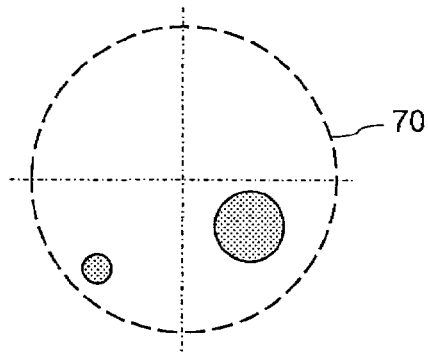
FIG. 23a shows a first partial irradiance distribution, which is produced in a system pupil surface during a first period.
Figure 23B:
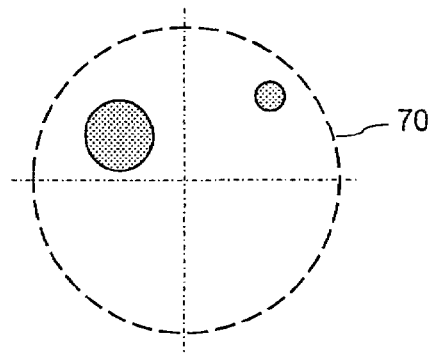
FIG. 23b shows a second partial irradiance distribution, which is produced in a system pupil surface during a second period.

This is illustrated in FIGS. 23a and 23b which show exemplary partial irradiance distributions in the system pupil surface 70 maintained during a first time interval and a successive second time interval, respectively. Each partial irradiance distribution corresponds to a particular angular distribution of light rays impinging on the illuminated field 14 of the mask 16.

1. Wafer Stepper Type

In the following it is first assumed that the projection exposure apparatus 10 is of the wafer stepper type. During the exposure process the mask 16 and the light sensitive surface 22 thus remain stationary for the total exposure time T. If, for example, the time intervals, during which the partial irradiance distributions shown in FIGS. 23a and 23b are produced in the system pupil surface 70, have equal length T/2, all points on the mask 16 will be illuminated for a time interval of length T/2 with an angular distribution corresponding to the partial irradiance distribution shown in FIG. 23a, and for a successive time interval of equal length T/2 with an angular distribution corresponding to the partial irradiance distribution shown in FIG. 23b. Another way of describing this effect is to say that the system pupil surface 70 is not filled in one go, but successively with the desired target total irradiance distribution.

Since most light sources 30 of projection exposure apparatus produce light pulses, the intervals between successive light pulses may be used to change the partial irradiance distribution in the system pupil surface 70. With a suitable layout of the mirror control unit 50, for example applying a control scheme as described in international patent application PCT/EP2008/010918 filed on Dec. 19, 2008, it is possible to tilt the mirrors $M_{ij}$ fast enough so that the partial irradiance distribution can be changed between two successive light pulses. In a wafer stepper it is, of course, likewise possible to make a longer interruption between two successive light pulses so that there is enough time to change the partial irradiance distribution in the system pupil plane 70.

2. Scanner Type

In projection exposure apparatus of the scanner type, it is not sufficient to completely fill the system pupil surface 70 during the entire exposure process, but during the (shorter) exposure time intervals during which each point on the mask is illuminated with projection light. These exposure time intervals are equal for all points on the mask, but have different starting (and consequently also finishing) times if points on the mask are spaced apart along the scan direction. For that reason the sequence of partial irradiance distributions produced in the system pupil surface 70 has to be repeated until the entire exposure process is terminated.

Figure 24:
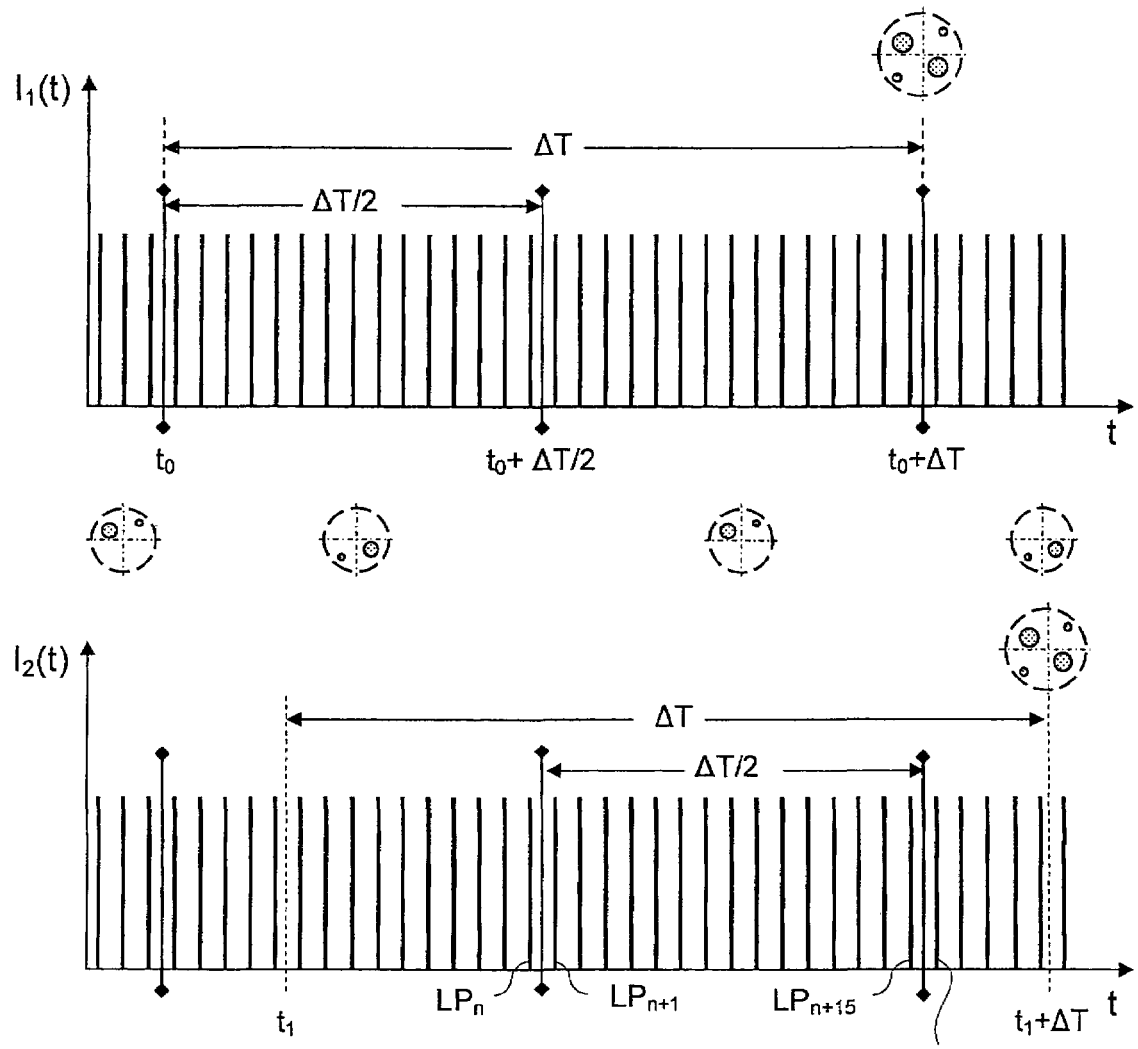
FIG. 24 shows two graphs illustrating the time dependency of the irradiance for two different points in the mask plane of projection exposure apparatus of the wafer stepper type.

FIG. 24 shows two graphs in which the time dependency of irradiances $I_1(t)$ and $I_2(t)$ on two points on the mask 16, which are spaced apart along the scan direction, are represented. In the upper graph it is assumed that the first point will move into the illuminated field 14 at a time $t_0$ during the exposure process. I will leave the illuminated field 14 at a later time $t_0+\Delta T$, with $\Delta T$ being the exposure time interval which is equal for all points on the mask 16 and denotes the time a point is illuminated during the exposure process. For the sake of simplicity it is further assumed that the partial irradiance distribution produced in the system pupil 70 will be changed to the configuration shown in FIG. 23a at time $t_0$. This partial irradiance distribution is maintained for a time $\Delta T/2$, as is indicated by small representations of the partial irradiance distributions between the upper and the lower graphs in FIG. 24.

After the first half of the exposure time interval $\Delta T$ the partial irradiance distribution is changed between two consecutive light pulses $LP_n$ and $LP_{n+1}$. During the second half of the exposure time interval $\Delta T$, the partial irradiance distribution shown in FIG. 23b is produced in the system pupil surface 70. When the exposure time interval is finished, the first point has received an equal number of light pulses with the partial irradiance distribution shown in FIG. 23a and with the partial irradiance distribution shown in FIG. 23b. The effective total irradiance distribution in the system pupil plane 70 is illustrated on top of the upper graph at time $t_0+\Delta T$.

The lower graph of FIG. 24 illustrates the same process for the second point which enters the illuminated field 14 later than the first point at a time $t_1>t_0$. During the exposure time interval $\Delta T$ associated with the second point the irradiance distribution in the system pupil surface 70 changes twice, namely a first time between the light pulses $LP_n$ and $LP_{n+1}$ and a second time between the light pulses $LP_{n+15}$ and $LP_{n+15+1}$. However, the number of light pulses impinging on the second point during the time intervals, in which the partial irradiance distribution shown in FIG. 23a is produced in the system pupil surface 70, and time intervals, in which the partial irradiance distribution shown in FIG. 23b is produced in the system pupil surface 70, are again equal. Thus also the second point will, after the end of its exposure time interval, be illuminated by light that is associated with the same effective total irradiance distribution in the system pupil surface 70 as the first point.

Some illumination systems are designed such that points on the mask are illuminated with a reduced irradiance at the beginning and the end of the exposure time intervals Δt associated with this point. This may be accomplished, for example, by using a field stop 82 having a plurality of movable blades that have a transmittance gradient along their longitudinal direction, as is described in US 2006/0244941 A1.

Figure 25:
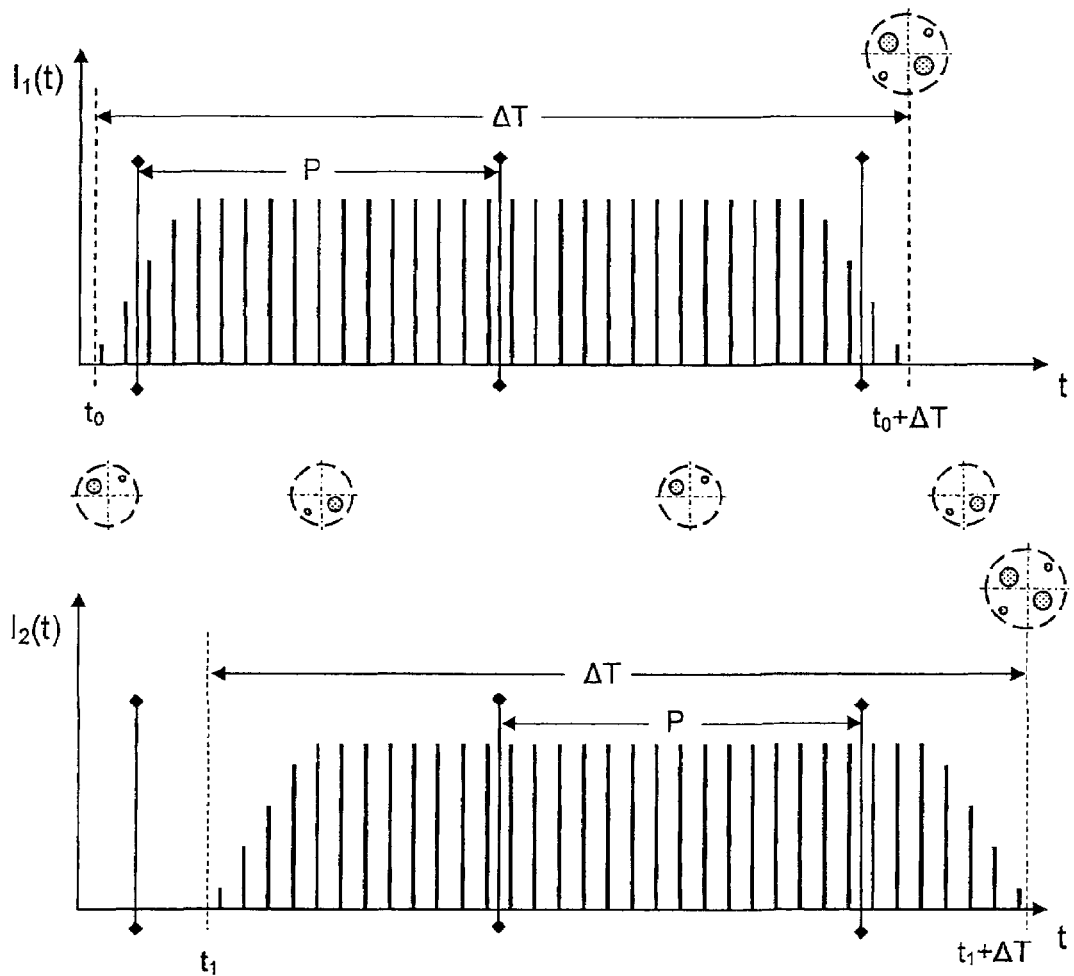
FIG. 25 shows two graphs illustrating the time dependency of the irradiance for two different points in the mask plane of projection exposure apparatus of the scanner type.

FIG. 25 shows two graphs similar to the graphs shown in FIG. 24, but for the assumption of light pulses having an increasing and a decreasing irradiance at the beginning and the end of each exposure time interval ΔT. In this case the period P, at which the irradiance distribution in the system pupil surface 70 is changed, has to be smaller than the exposure time interval ΔT, and the incline and the decline of the irradiance of the light pulses at the beginning and the end of the exposure time interval should be symmetrical.

As can be seen best in the lower part of FIG. 25 illustrating the time dependency of the irradiance on the second point, the number of light pulses associated with a particular partial irradiance distribution in the system pupil surface 70 are different. However, if not the number, but also the irradiance of the light pulses are taken into account, it can be seen that the total irradiance impinging on a point on the mask during the exposure time interval ΔT is the same for each irradiance distribution in the system pupil surface 70.

3. Other Examples of Partial Irradiance Distributions

As a matter of course, this concept is not restricted to only two partial irradiance distributions that are successively produced in the system pupil surface 70.

Figures 26A, 26B, 26C, 26D:
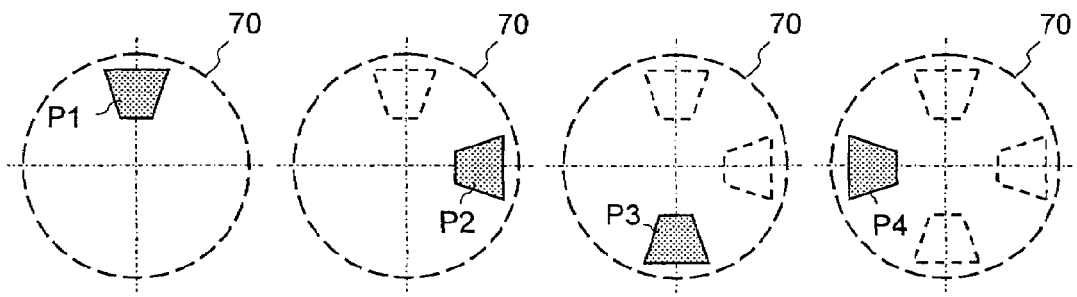
FIGS. 26a to 26d show four first exemplary partial irradiance distributions, which are successively produced in a system pupil surface.

FIGS. 26a to 26d illustrate four different partial irradiance distributions P1 to P4 that are produced successively during the exposure process in the system pupil surface 70. During each period P one of the poles P1 to P4 is produced in the system pupil surface 70. After four periods P each point on the mask 16 has been effectively illuminated with light from directions that are associated with the four poles P1 to P4, as is illustrated in FIG. 26d. The exposure time interval ΔT has to be equal to or greater than 4P.

FIGS. 27a and 27b show other partial irradiance distributions that are successively produced in the pupil plane 70. In this embodiment the total areas illuminated during each period significantly differ. If the central pole P0 is supposed to receive the same irradiance as the four outer poles P1, P2, P3 and P4 produced during the other period, some of the mirrors $M_{ij}$ in the array 46 have to be brought into an off-state in which they do not direct any light towards the system pupil surface 70.

FIGS. 28a and 28b show two partial irradiance distributions that are produced successively in the system pupil surface 70 according to still another embodiment. Here the partial irradiance distributions are not restricted to certain segments of the system pupil surface, but are arranged in an interleaved manner. For the sake of simplicity the spots produced by each mirror $M_{ij}$ in the system pupil surface 70 are assumed to be squares. These squares are arranged in both partial irradiance distributions in a chessboard like manner, but will offset by one square. The combination of the two partial irradiance distributions results in a conventional illumination setting with a uniformly illuminated circular area. A high edge resolution is achieved although the number of mirrors $M_{ij}$ is small. This interleaved configuration of partial irradiance distributions has also the advantage that the mirrors $M_{ij}$ have only to be slightly readjusted when the irradiance distribution is changed. This simplifies the control of the mirrors $M_{ij}$ and reduces the mechanical strain on the mirrors and on the actuators used to adjust the tilting angles.

Other embodiments are in the following claims.

The invention claimed is:

1. A method, comprising:
   providing an illumination system of a projection exposure apparatus, the illumination system comprising an array of beam deflection elements, each beam deflection element being reflective or transparent, each beam deflection element being adapted to deflect an impinging light beam by a deflection angle that is variable, and the illumination system having a pupil surface in which an irradiance distribution is produced by the array; and
   using the illumination system to produce an illuminated field on a mask with light pulses,
   wherein:
   the beam deflecting elements are controlled so that each of a plurality of partial irradiance distributions in the pupil surface of the illumination system is successively produced for a point on the mask; and
   while successively producing the plurality of partial irradiance distributions for the point on the mask, the mask is moved so that the point on the mask moves into and leaves the illuminated field only once.

2. The method of claim 1, further comprising imaging the mask onto a light sensitive surface.

3. The method of claim 1, further comprising moving the mask and a light sensitive surface as the mask is illuminated with the light pulses so that two points on the mask spaced apart along a scan direction are illuminated during time intervals having different starting times, wherein, for a point on the mask, all partial irradiance distributions are produced in the pupil surface of the illumination system during a time interval associated with that point.

4. The method of claim 1, wherein time intervals, during which all partial irradiance distributions are produced in the pupil plane of the illumination system, are all equal.

5. The method of claim 1, wherein the partial irradiance distributions are restricted to illuminate a segment of the pupil surface.

6. The method of claim 5, wherein the segment is a semicircle or a quadrant.

7. The method of claim 1, wherein the partial irradiance distributions are interleaved.

8. The method of claim 1, wherein:
   the light pulses include a first light pulse and a second light pulse different from the first light pulse;
   the plurality of partial irradiance distributions includes a first partial irradiance distribution and a second partial irradiance distribution different from the first partial irradiance distribution; and
   the method comprises:
      producing the first partial irradiance distribution with the first light pulse; and
      producing the second partial irradiance distribution with the second light pulse.

9. The method of claim 1, wherein:
the plurality of partial irradiance distributions includes a first partial irradiance distribution and a second partial irradiance distribution different from the first partial irradiance distribution; and
the method comprises:
producing the first partial irradiance distribution at a first time; and
producing the second partial irradiance distribution at a second time different from the first time.

10. The method of claim 1, wherein each beam deflection element is reflective.

11. The method of claim 1, wherein each beam deflection element is transparent.

12. A system, comprising:
an illumination system, comprising:
an array of beam deflection elements, each beam deflection element being reflective or transparent, each beam deflection element being adapted to deflect an impinging light beam by a deflection angle that is variable in response to control signals, and the illumination system having a pupil surface in which an irradiance distribution is produced by the array; and
a control unit configured to control the beam deflection elements,
wherein:
the illumination system is configured to be used in a projection exposure apparatus to produce an illuminated field on a mask during operation of the system, and
the control unit is configured to control the beam deflecting elements so that each of a plurality of partial irradiance distributions is successively obtained in the pupil surface for a point on the mask, and
while successively producing the plurality of partial irradiance distributions in the pupil surface for the point on the mask, the mask is moved so that the point on the mask moves into and leaves the illuminated field only once.

13. An apparatus, comprising:
the system of claim 12; and
a projection objective,
wherein the apparatus is a projection exposure apparatus.

14. The system of claim 12, wherein the control unit is configured to control the beam deflecting elements so that all partial irradiance distributions are successively obtained in the pupil surface during a time interval during which the point on the mask is illuminated by the illumination system.

15. A method, comprising:
providing an illumination system of a projection exposure apparatus, the illumination system comprising an array of beam deflection elements, each beam deflection element being reflective or transparent, each beam deflection element being adapted to deflect an impinging light beam by a deflection angle that is variable, and the illumination system having a pupil surface in which an irradiance distribution is produced by the array; and
using the illumination system to produce an illuminated field on a mask and to illuminate a point on the mask with light pulses including a first light pulse and a second light pulse different from the first light pulse,
wherein:
a plurality of partial irradiance distributions includes a first partial irradiance distribution and a second partial irradiance distribution different from the first partial irradiance distribution;
the method comprises:
producing the first partial irradiance distribution with the first light pulse; and
producing the second partial irradiance distribution with the second light pulse, and
while the first partial irradiance distribution and the second partial irradiance distribution are successively produced at the point on the mask, the mask is moved so that the point on the mask moves into and leaves the illuminated field only once.

16. The method of claim 15, further comprising moving the mask and a light sensitive surface as the mask is illuminated with the light pulses so that two points on the mask spaced apart along a scan direction are illuminated during time intervals having different starting times, wherein, for at least one point on the mask, all partial irradiance distributions are produced in the pupil surface of the illumination system during a time interval associated with the at least one point.

17. The method of claim 15, wherein time intervals, during which all partial irradiance distributions are produced in the pupil plane of the illumination system, are all equal.

18. The method of claim 15, wherein the partial irradiance distributions are restricted to illuminate a segment of the pupil surface.

19. The method of claim 18, wherein the segment is a semicircle or a quadrant.

20. The method of claim 15, wherein the partial irradiance distributions are interleaved.

21. A method, comprising:
providing an illumination system of a projection exposure apparatus, the illumination system comprising an array of beam deflection elements, each beam deflection element being reflective or transparent, each beam deflection element being adapted to deflect an impinging light beam by a deflection angle that is variable, and the illumination system having a pupil surface in which an irradiance distribution is produced by the array; and
using the illumination system to produce an illuminated field on a mask and to illuminate a point on the mask with light pulses,
wherein:
a plurality of partial irradiance distributions includes a first partial irradiance distribution and a second partial irradiance distribution different from the first partial irradiance distribution;
the method comprises:
producing the first partial irradiance distribution at a first time for the point on the mask; and
producing the second partial irradiance distribution at a second time different from the first time for the point on the mask, and
while successively producing the first partial irradiance distribution and the second partial irradiance distribution at the point on the mask, the mask is moved so that the point on the mask moves into and leaves the illuminated field only once.

22. The method of claim 21, further comprising moving the mask as the mask is illuminated with the light pulses so that two points on the mask spaced apart along a scan direction are illuminated during time intervals having different starting times, wherein, for at least one point on the mask, the first partial irradiance distributions and the second partial irradiance distribution are produced in the pupil surface of the illumination system during a time interval associated with the at least one point.

* * * * *

UNITED STATES PATENT AND TRADEMARK OFFICE
CERTIFICATE OF CORRECTION

PATENT NO.      : 9,013,680 B2
APPLICATION NO. : 12/836436
DATED           : April 21, 2015
INVENTOR(S)     : Fiolka et al.

Page 1 of 1

It is certified that error appears in the above-identified patent and that said Letters Patent is hereby corrected as shown below:

In the specification

Column 10, Line 5-10, delete "a control unit, wherein the control unit is configured to control the beam deflection elements such that the illuminated area associated with an irradiance distribution produced in the system pupil surface changes between two consecutive light pulses ($LP_n$, $LP_{n+1}$) of an exposure process during which the mask is imaged on a light sensitive surface." and insert same at Column 10, Line 4.

Column 23, Line 14, delete "$\Delta t$" insert --$\Delta T$--.

Signed and Sealed this
Sixth Day of October, 2015

Michelle K. Lee
*Director of the United States Patent and Trademark Office*